US012531200B2

(12) United States Patent
Fitzgerald et al.

(10) Patent No.: US 12,531,200 B2
(45) Date of Patent: Jan. 20, 2026

(54) ACTIVE CHARGE BLEED METHODS FOR MEMS SWITCHES

(71) Applicant: Analog Devices International Unlimited Company, Limerick (IE)

(72) Inventors: Padraig Fitzgerald, County Limerick (IE); David Aherne, Limerick (IE); Patrick M. McGuinness, County Limerick (IE); Naveen Dhull, County Limerick (IE); Michael James Twohig, County Limerick (IE); Philip James Brennan, County Limerick (IE); Donal P. McAuliffe, County Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 57 days.

(21) Appl. No.: 18/512,949

(22) Filed: Nov. 17, 2023

(65) Prior Publication Data

US 2024/0087829 A1 Mar. 14, 2024

Related U.S. Application Data

(63) Continuation of application No. PCT/IB2022/000271, filed on May 17, 2022.

(Continued)

(51) Int. Cl.

*H01H 59/00* (2006.01)
*B81B 7/02* (2006.01)

(52) U.S. Cl.

CPC ........... *H01H 59/0009* (2013.01); *B81B 7/02* (2013.01); *B81B 2207/03* (2013.01); *B81B 2207/053* (2013.01)

(58) Field of Classification Search

CPC . B81B 7/02; B81B 2207/03; B81B 2207/053; H01H 59/0009; H01H 2001/0084; H01H 2059/0027

(Continued)

(56) References Cited

U.S. PATENT DOCUMENTS

| | | | |
|---|---|---|---|
| 5,880,921 | A | 3/1999 | Tham et al. |
| 6,229,683 | B1 | 5/2001 | Halden et al. |

(Continued)

FOREIGN PATENT DOCUMENTS

| | | | |
|---|---|---|---|
| CN | 101118819 | A | 2/2008 |
| CN | 101402100 | A | 4/2009 |

(Continued)

OTHER PUBLICATIONS

International Search Report and Written Opinion mailed Oct. 14, 2022 in connection with International Application No. PCT/IB2022/000271.

(Continued)

*Primary Examiner* — Kevin J Comber

(74) *Attorney, Agent, or Firm* — Schwegman Lundberg & Woessner, P.A.

(57) ABSTRACT

Impedance paths for integrated circuits having microelectromechanical systems (MEMS) switches that allow for electrical charge to bleed from circuit nodes to fixed electric potentials (e.g., ground) are described. Such paths are referred to herein as charge bleed circuits. The circuit nodes may be circuit locations where electrical charge may accumulate because there is no other path for the electrical charge to dissipate. In some embodiments, a charge bleed circuit includes a switchable device (e.g., a MEMS switch, a solid-state device switch, or a circuit including various solid-state device switches that, collectively, implement a device that can be switched on and off) that connects and (Continued)

disconnects the impedance path from a circuit node. This may allow the device to perform different types of measurements at desired performance levels.

18 Claims, 32 Drawing Sheets

Related U.S. Application Data

(60) Provisional application No. 63/190,206, filed on May 18, 2021.

(58) Field of Classification Search
USPC .................................................. 361/211, 212
See application file for complete search history.

(56) References Cited

U.S. PATENT DOCUMENTS

| | | | |
|---|---|---|---|
| 6,388,631 | B1 | 5/2002 | Livingston et al. |
| 6,531,668 | B1 | 3/2003 | Ma |
| 6,686,820 | B1 | 2/2004 | Ma et al. |
| 6,879,429 | B2 | 4/2005 | Wong et al. |
| 6,940,363 | B2 | 9/2005 | Zipper et al. |
| 6,972,881 | B1 | 12/2005 | Chester |
| 7,102,472 | B1 | 9/2006 | Nathanson et al. |
| 7,119,943 | B2 | 10/2006 | Nelson et al. |
| 7,808,764 | B2 | 10/2010 | O'Brien et al. |
| 7,821,466 | B2 | 10/2010 | Lempkowski |
| 7,839,611 | B2 | 11/2010 | Rivers, Jr. et al. |
| 7,864,006 | B2 | 1/2011 | Foster et al. |
| 7,864,491 | B1 * | 1/2011 | Bauder .................... H01H 9/30 361/13 |
| 8,079,262 | B2 | 12/2011 | Guo |
| 8,194,382 | B2 | 6/2012 | Ellis et al. |
| 8,203,880 | B2 | 6/2012 | Schepens et al. |
| 8,230,788 | B2 | 7/2012 | Brooks et al. |
| 8,334,729 | B1 | 12/2012 | Khlat |
| 8,358,488 | B2 | 1/2013 | Premerlani et al. |
| 8,499,629 | B2 | 8/2013 | Ballas et al. |
| 8,610,519 | B2 | 12/2013 | Keimel et al. |
| 8,638,093 | B2 | 1/2014 | Aimi et al. |
| 8,861,218 | B2 | 10/2014 | Smith et al. |
| 8,916,996 | B2 | 12/2014 | Aimi et al. |
| 8,978,475 | B2 | 3/2015 | Acar |
| 9,077,060 | B2 | 7/2015 | Nguyen et al. |
| 9,117,610 | B2 | 8/2015 | Aimi et al. |
| 9,156,677 | B2 | 10/2015 | Bauder et al. |
| 9,159,516 | B2 | 10/2015 | Hammond et al. |
| 9,221,677 | B2 | 12/2015 | Kim |
| 9,362,608 | B1 | 6/2016 | Lee et al. |
| 9,739,875 | B2 | 8/2017 | Koptenko |
| 9,748,048 | B2 | 8/2017 | Fitzgerald et al. |
| 9,911,563 | B2 | 3/2018 | Macnamara et al. |
| 10,029,914 | B2 | 7/2018 | Huffman et al. |
| 10,033,179 | B2 | 7/2018 | Fitzgerald et al. |
| 10,068,733 | B2 | 9/2018 | Kiu et al. |
| 10,083,811 | B2 | 9/2018 | Kiu et al. |
| 10,141,495 | B1 | 11/2018 | Nordquist et al. |
| 10,254,361 | B2 | 4/2019 | Robb et al. |
| 10,388,468 | B2 | 8/2019 | Sampath et al. |
| 10,867,757 | B2 | 12/2020 | Nguyen et al. |
| 2002/0075094 | A1 | 6/2002 | Bechtle et al. |
| 2002/0186108 | A1 | 12/2002 | Hallbjorner |
| 2002/0186449 | A1 | 12/2002 | Anderson et al. |
| 2004/0031670 | A1 | 2/2004 | Wong |
| 2004/0113713 | A1 * | 6/2004 | Zipper .................. H01H 9/541 333/105 |
| 2004/0155729 | A1 | 8/2004 | Ko et al. |
| 2007/0139145 | A1 | 6/2007 | Subramanian et al. |
| 2009/0201119 | A1 | 8/2009 | Rubel |
| 2009/0272634 | A1 | 11/2009 | Ehlers et al. |
| 2012/0080737 | A1 | 4/2012 | Zaitsu et al. |
| 2012/0286588 | A1 | 11/2012 | Steeneken et al. |
| 2016/0006241 | A1 | 1/2016 | Fitzgerald et al. |
| 2017/0225942 | A1 | 8/2017 | Fitzgerald et al. |
| 2019/0013668 | A1 | 1/2019 | Fitzgerald et al. |
| 2019/0049482 | A1 | 2/2019 | Motiee |
| 2019/0172671 | A1 | 6/2019 | Khlat et al. |
| 2019/0371554 | A1 | 12/2019 | Khlat |
| 2020/0025792 | A1 | 1/2020 | Reinke |
| 2020/0116487 | A1 | 4/2020 | Ward et al. |

FOREIGN PATENT DOCUMENTS

| | | | |
|---|---|---|---|
| CN | 104868868 | | 8/2015 |
| CN | 110275286 | A | 9/2019 |
| DE | 102015110467 | A1 | 1/2016 |
| JP | 2007-174064 | A | 7/2007 |
| JP | 4348390 | B2 | 10/2009 |
| KR | 100522895 | B1 | 10/2005 |
| KR | 100678346 | B1 | 2/2007 |
| KR | 100717870 | B1 | 5/2007 |
| KR | 101468743 | B1 | 12/2014 |
| WO | WO 02/09224 | A1 | 1/2002 |
| WO | WO 2007/077353 | A2 | 7/2007 |
| WO | WO 2007/078589 | A1 | 7/2007 |
| WO | WO 2010/056435 | A2 | 5/2010 |
| WO | WO 2012/088821 | A1 | 7/2012 |
| WO | WO 2017/007428 | A1 | 1/2017 |

OTHER PUBLICATIONS

International Preliminary Report on Patentability mailed Nov. 30, 2023 in connection with International Application No. PCT/IB2022/000271.

International Search Report and Written Opinion mailed Sep. 14, 2022 in connection with International Application No. PCT/US2022/029593.

International Preliminary Report on Patentability mailed Nov. 30, 2023 in connection with International Application No. PCT/US2022/029593.

[No Author Listed], 300V, Low-Charge Injection, 16-Channel, High-Voltage Analog Switch. Microchip Technology Inc. HV2621/HV2721/HV2722. Sep. 2019; DS20006082A, 26 pages.

[No Author Listed], Low Charge Injection 32-Channel High Voltage Analog Switch with Bleed Resistor. Supertex, Inc., Part HV2901 Datasheet, 2012 [last accessed Dec. 19, 2023]. 10 pages.

[No Author Listed], MM3100—6 Channel SPST Digital-Micro-Switch. Menlo Microsystems, Inc., Application Note. Mar. 30, 2018; Doc Rev. MM3100Appl v1.0, 27 pages.

[No Author Listed], No High-Voltage Bias, Low Harmonic Distortion, 32-Channel, High-Voltage Analog Switch with L-Switch Architecture. Microchip Technology Inc. HV2070. Feb. 2019; DS20005923A, 34 pages.

Lin et al., A Resonance Dynamical Approach to Faster, More Reliable Micromechanical Switches. In2008 IEEE International Frequency Control Symposium May 19, 2008; pp. 640-5.

Yu et al., A Vibration-Based MEMS Piezoelectric Energy Harvester and Power Conditioning Circuit. Sensors. Feb. 19, 2014;14(2):3323-41.

"German Application Serial No. 112022002639.1, Office Action mailed Dec. 12, 2025", w/ English machine translation, 17 pgs.

* cited by examiner

From FIG 16A

ACTIVE CHARGE BLEED METHODS FOR MEMS SWITCHES

CROSS-REFERENCE TO RELATED APPLICATIONS

This application is a Continuation of International Patent Application Serial No. PCT/IB2022/000271, filed May 17, 2022, and entitled "ACTIVE CHARGE BLEED METHODS FOR MEMS SWITCHES," which is hereby incorporated herein by reference in its entirety.

International Patent Application Serial No. PCT/IB2022/000271 claims the benefit under 35 U.S.C. § 119(e) of U.S. Provisional Patent Application Ser. No. 63/190,206, entitled "ACTIVE CHARGE BLEED METHODS FOR MEMS SWITCHES", filed May 18, 2021, which is hereby incorporated herein by reference in its entirety.

FIELD OF THE DISCLOSURE

The technology described in the present application relates to microelectromechanical system (MEMS) switches.

BACKGROUND

Some MEMS switches include cantilevered beams. The switch is closed when the free end of the beam is pulled into contact with an underlying substrate by application of an electric field generated by applying a voltage to an electrode on the substrate. When no voltage is applied to the electrode on the substrate, and therefore no electric field is generated, the spring restoring force of the beam causes the free end of the beam to not contact the substrate, such that the switch is open. Often the MEMS switch opens and closes a connection to a circuit coupled to the MEMS switch.

SUMMARY OF THE DISCLOSURE

Some embodiments relate to impedance paths for integrated circuits having microelectromechanical systems (MEMS) switches that allow for electrical charge to bleed from circuit nodes to fixed electric potentials (e.g., ground). Such paths are referred to herein as charge bleed circuits. The circuit nodes may be circuit locations where electrical charge may accumulate because there is no other path for the electrical charge to dissipate. In some embodiments, a charge bleed circuit includes a switchable device (e.g., a MEMS switch, a solid-state device switch, or a circuit including various solid-state device switches that, collectively, implement a device that can be switched on and off) that connects and disconnects the impedance path from a circuit node. This may allow the device to perform different types of measurements at desired performance levels.

Some embodiments relate to a microelectromechanical systems (MEMS) device comprising: a MEMS switch; a circuit node electrically connected to a side of the MEMS switch; a charge bleed circuit comprising a switchable device, the charge bleed circuit connecting the circuit node to a fixed electric potential; and control circuitry configured to maintain the switchable device in a non-conductive state during a time interval in which the MEMS switch is in a conductive state.

In some embodiments, the circuit node is a first circuit node, the side of the MEMS switch is a first side, and the charge bleed circuit is a first charge bleed circuit, and the switchable device is a first switchable device, and wherein the MEMS device further comprises: a second circuit node electrically connected to a second side of the MEMS switch; and a second charge bleed circuit comprising a second switchable device, the second charge bleed circuit connecting the second circuit node to the fixed electric potential.

In some embodiments, the control circuitry is further configured to maintain the second switchable device in a non-conductive state during the time interval.

In some embodiments, the switchable device comprises a MEMS switch.

In some embodiments, the switchable device comprises a solid-state device switch.

In some embodiments, the solid-state device switch comprises a field effect transistor (FET) and/or a diode.

In some embodiments, the charge bleed circuit further comprises a resistor in series with the switchable device.

In some embodiments, the resistor is monolithically integrated with the MEMS switch.

In some embodiments, when the switchable device is in a conductive state, the resistor couples the circuit node to the fixed electric potential, and when the switchable device is in the non-conductive state, the circuit node is floating.

In some embodiments, the MEMS switch comprises a cantilevered MEMS switch or a teeter-totter MEMS switch.

Some embodiments relate to a MEMS device comprising: a MEMS switch; a circuit node electrically connected to a side of the MEMS switch; a resistive charge bleed circuit comprising a switchable device, the charge bleed circuit connecting the circuit node to a fixed electric potential; and control circuitry configured to maintain the switchable device coupled to the fixed electric potential when the MEMS switch is in a conductive state.

In some embodiments, the MEMS device of 11, wherein the circuit node is a first circuit node, the side of the MEMS switch is a first side, and the charge bleed circuit is a first resistive charge bleed circuit, and the switchable device is a first switchable device, and wherein the MEMS device further comprises: a second circuit node electrically connected to a second side of the MEMS switch; and a second resistive charge bleed circuit comprising a second switchable device, the second resistive charge bleed circuit connecting the second circuit node to the fixed electric potential.

In some embodiments, the control circuitry is further configured to maintain the second switchable device coupled to the fixed electric potential when the second MEMS switch is in a conductive state.

In some embodiments, the switchable device comprises a MEMS switch.

In some embodiments, the switchable device comprises a solid-state device switch.

In some embodiments, when the switchable device is in a conductive state, the resistive charge bleed circuit couples the circuit node to the fixed electric potential, and when the switchable device is in the non-conductive state, the circuit node is floating.

Some embodiments relate to a method of operating a MEMS device comprising a MEMS switch, the method comprising: decoupling a side of the MEMS switch from a fixed electric potential by interrupting a resistive charge bleed circuit, wherein interrupting the charge bleed circuit comprises turning off a switchable device; at a first time, turning on the MEMS switch; and at second time subsequent to the first time, turning off the MEMS switch, wherein, during at least a time interval defined between the first time and the second time, the side of the MEMS switch is decoupled from the fixed electric potential.

In some embodiments, decoupling the side of the MEMS switch from the fixed electric potential occurs prior to the first time.

In some embodiments, decoupling the side of the MEMS switch from the fixed electric potential occurs at the first time.

In some embodiments, the method further comprises coupling the side of the MEMS switch to the fixed electric potential by forming the resistive charge bleed circuit, wherein forming the charge bleed circuit comprises turning on the switchable device, wherein coupling the side of the MEMS switch to the fixed electric potential occurs at, or subsequent to, the second time.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1B:
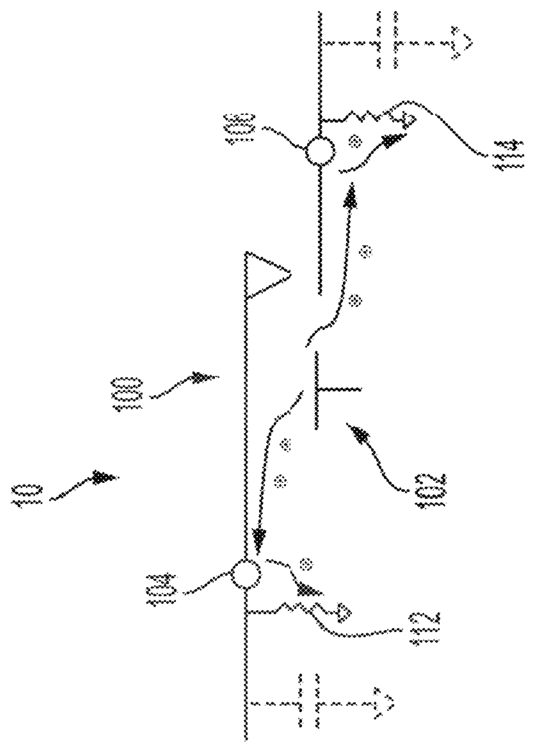
FIG. 1B is a schematic diagram of a MEMS switch having resistive charge bleed circuits, in accordance with some embodiments.

Aspects of the present application provide impedance paths for integrated circuits having microelectromechanical systems (MEMS) switches that allow for electrical charge to bleed from circuit nodes to fixed electric potentials (e.g., ground). Such paths are referred to herein as charge bleed paths or charge bleed circuits. The circuit nodes may be circuit locations where electrical charge may accumulate because there is no other path for the electrical charge to dissipate. In some instances, the circuit node may be considered as a "floating node" if an impedance path is not otherwise provided. The circuit nodes may be located on sides of the MEMS switches. For example, one circuit node may be electrically connected to one side of a MEMS switch and another circuit node may be electrically connected to another side of the MEMS switch. An impedance path may connect a circuit node to a fixed electric potential (e.g., a ground potential or a supply voltage). The impedance path may include one or more circuit components forming a charge bleed circuit connecting the circuit node to the fixed electric potential. In some embodiments, the charge bleed circuit may include a resistor. As such, the charge bleed circuit is referred to as a resistive charge bleed circuit.

The applicant of the present application has appreciated that for some circuits, particularly those including MEMS switches, there are some nodes of the circuit that lack any impedance path to a fixed electric potential and thus parasitic charge can accumulate on those nodes. This parasitic charge accumulation may lead to unstable performance and hot switching in the circuit, which may result in damage to the device. Hot switching occurs either if a voltage differential exists between the switch terminals when the switch is in the conductive state, or if a current flows through the switch despite the switch being in the non-conductive state. In cold switching, on the other hand, there is generally no voltage differential present between the switch terminals when the switch is in the conductive state and there is no current flowing through the switch when the switch is in the non-conductive state. Hot switching can result in a reduced switch lifetime which depends upon the magnitude of the open-circuit voltage between the switch terminals. Introducing an impedance path, such as by connecting a resistor between one of these nodes and a ground potential, may allow for improved performance of devices having MEMS switches. Accordingly, some embodiments of the present application relate to MEMS devices that include a charge bleed circuit having a resistor connecting a circuit node to a fixed electric potential.

The applicant of the present application has further appreciated that introducing an impedance path in a circuit may impact the ability of the circuit to perform low voltage measurements. The impedance path forms an alternative path for electrical charge, which may create a leakage path for a signal and negatively impact performance of the device, particularly at lower voltages. The applicant has appreciated that including a switchable device (e.g., a MEMS switch, a solid-state device switch, or a circuit including various solid-state device switches that, collectively, implement a device that can be switched on and off) that connects and disconnects the impedance path from a circuit node may allow the device to perform different types of measurements at desired performance levels. For example, when performing low voltage measurements, the switch may be open such that the impedance path is disconnected and has little to no impact on performance of the device. After the measurements are performed, the switch may be closed such that the impedance path is connected, allowing any parasitic charge accumulated on the circuit node to dissipate. Accordingly, some embodiments of the present application relate to charge bleed circuits that include a switchable device. The switchable device may include a MEMS switch, a solid-state device switch (e.g., a field effect transistor (FET) or a diode), or a circuit including a combination of transistors and diodes.

The impedance paths discussed herein may be implemented in integrated circuits having one or more MEMS switches. According to some embodiments, the MEMS switch may be a cantilever switch having a cantilevered beam. The switch is closed when the free end of the beam is pulled into contact with an underlying substrate by application of an electric field generated by applying a voltage to an electrode on the substrate. When no voltage is applied to the electrode on the substrate, and therefore no electric field is generated, the spring restoring force of the beam causes the free end of the beam to not contact the substrate, such that the switch is open. Often the MEMS switch opens and closes a connection to a circuit coupled to the MEMS switch. In some embodiments, a charge bleed circuit forming an impedance path as described herein may connect to a circuit node on the beam side of the cantilever switch. In some embodiments, a charge bleed circuit forming an impedance path as described herein may connect to a circuit node on the substrate side of the cantilever switch.

According to some embodiments, the MEMS switch may have a teeter-totter configuration. The MEMS switch may include a relatively stiff beam connected to an underlying substrate by an anchor (e.g., a post) which may be centrally located with respect to the beam, and one or more hinges connecting the beam to the post. The beam may tilt to contact an underlying substrate by application of an electric field generated by applying a voltage to an electrode on the substrate. The MEMS switch may be configured to be actively closed and opened by the tilting of the beam. Charge bleed circuits forming impedance paths as described herein may connect to circuit nodes on the substrate.

The MEMS devices and impedance path circuit configurations described herein may be implemented for RF signals having varying power levels and peak voltages. In some embodiments, the RF signals may have power levels that range between 30-49 dBm, between 20-50 dBm, 20-30 dBm, or 20-40 dBm, among other possible ranges. In some embodiments, the RF signals may have peak voltages that range between 9.998-89.112 V, between 10-90 V, between 10-100 V, between 30-90 V, between 30-90 V, among other possible ranges. For example, an RF signal having a 36 dBm power level may have a peak voltage of 19.95 V.

Thus, some embodiments relate to a MEMS device comprising a MEMS switch, where a circuit node electrically connects to a side of the MEMS switch. The MEMS switch may be a cantilevered MEMS switch or a teeter-totter MEMS switch, among other types of MEMS switches. A charge bleed circuit connects the circuit node to a fixed electric potential (e.g., a ground potential or a supply voltage). The charge bleed circuit may comprise a resistor and a switchable device in series with the resistor. The switchable device may include a MEMS switch or one or more solid state switch devices (e.g., a transistor, a diode or a circuit including for example transistors and/or diodes collectively configured to implement a device than can be turned on and off). Control circuitry is configured to maintain the switchable device in a non-conductive (OFF) state during a time interval in which the MEMS switch is in a conductive (ON) state. In some embodiments, when the switchable device is in a conductive state, the resistor couples the circuit node to the fixed electric potential; and when the switchable device is in the non-conductive state, the circuit node is floating. In some embodiments, a further charge bleed circuit connects a second circuit node electrically connected to a second side of the MEMS switch to the fixed electric potential. This further charge bleed circuit comprises a second resistor and a second switchable device in series with the second resistor. In such embodiments, the control circuitry may be further configured to maintain the second switchable device in a non-conductive state during the time interval.

Further embodiments relate to a method for operating a MEMS switch. The method may involve i) decoupling a side of the MEMS switch from a fixed electric potential by interrupting a resistive charge bleed circuit (interrupting the charge bleed circuit may comprise turning off a switchable device), ii) at a first time, turning on the MEMS switch; iii) at second time subsequent to the first time, turning off the MEMS switch such that, during at least a time interval defined between the first time and the second time, the side of the MEMS switch is decoupled from the fixed electric potential, and iv) coupling the side of the MEMS switch to the fixed electric potential by forming the resistive charge bleed circuit (forming the charge bleed circuit may comprise turning on the switchable device). Decoupling the side of the MEMS switch from the fixed electric potential may occurs at, or prior to, the first time. Coupling the side of the MEMS switch to the fixed electric potential may occur at, or subsequent to, the second time The aspects and embodiments described above, as well as additional aspects and embodiments, are described further below. These aspects and/or embodiments may be used individually, all together, or in any combination of two or more, as the application is not limited in this respect.

Figure 1A:
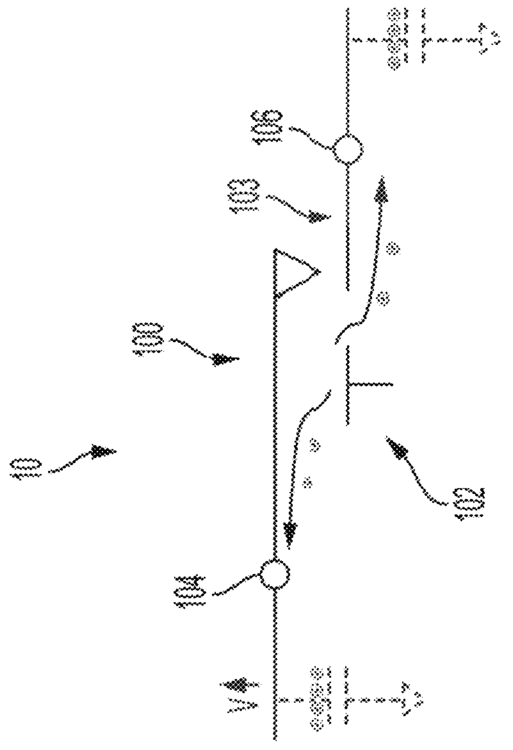
FIG. 1A is a schematic diagram of a MEMS switch exhibiting accumulation of electric charge.

As discussed herein, aspects of the present application relate to MEMS devices having impedance paths located on sides of MEMS switches that dissipate charge accumulation on nodes in the circuit. FIG. 1A shows an exemplary schematic of a MEMS switch suffering from charge accumulation on circuit nodes located on either side of the MEMS switch. FIG. 1B shows how impedance paths can be used to bleed charge from these nodes in accordance with some embodiments. The device of FIG. 1A includes a cantilevered MEMS switch 10 having a movable beam 100, a gate electrode 102 and an electrode 103. Gate electrode 102 and electrode 103 are placed on a surface of a substrate. Beam 100 is connected to an anchor (not shown) and is free to pivot about the anchor outside the plane of the beam. The anchor is connected to and extends away from the substrate. Application of a voltage to gate electrode 102 (e.g., between 60V and 100V) causes beam 100 to pivot, via electrostatic attraction, about the anchor towards the substrate. When beam 100 pivots by a sufficient amount to contact electrode 103, the circuit is closed thus forming an electric path from node 104 (on the left side of the switch) to node 106 (on the right side of the switch). When the voltage applied to gate electrode 102 is released, beam 102 pivots away from the substrate.

In some circumstances, electric charge may accumulate on node 104, node 106, or both. Accumulation of charge effectively creates a parasitic capacitance between the node and the substrate, and a voltage across the terminals of the capacitance. This voltage can distort the regular operation of the switch, for example by leading to hot switching. Charge accumulation may be particularly severe in cantilevered MEMS switches of the types described herein given the relatively high voltage (e.g., between 60V and 100V) often required to actuate a cantilevered beam.

In FIG. 1B, a resistor 112 is added between node 104 and ground and a resistor 114 is added is added between node 106 and ground. These resistors create charge bleed circuits to ground which cause the accumulated charge to dissipate and the parasitic voltage to disappear. While the circuits of FIGS. 1A-1B represent cantilevered MEMS switches, charge accumulation may occur in other types of switches as well, including teeter-totter MEMS switches, and may be dissipated using resistive charge bleed circuits in a similar manner.

Figure 2:
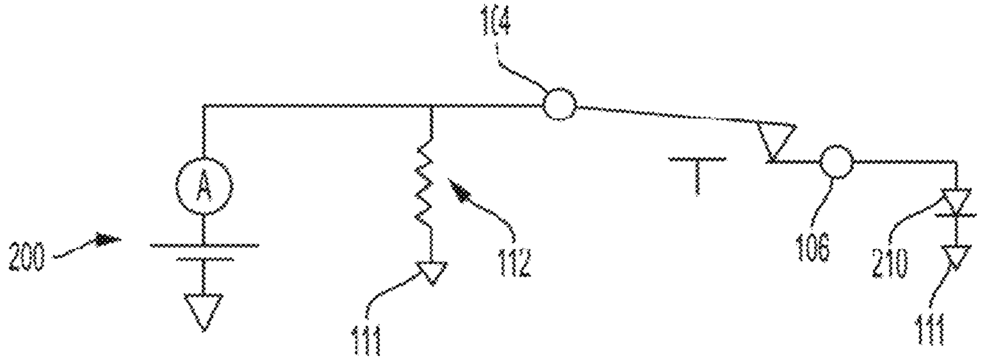
FIG. 2 is a schematic diagram of a MEMS switch having a resistive charge bleed circuit, in accordance with some embodiments.

FIG. 2 illustrates the MEMS switch of FIG. 1B, with node 104 being connected to a signal source 200 and node 106 being connected to a load 210 (a diode in this example). When the beam contacts the substrate, a path is formed between signal source 200 and load 210. Resistor 112 prevents accumulation of electric charge on node 104. In this example, resistor 112 is connected to fixed electric potential 111, which may be ground or a supply voltage, for example.

Figure 3:
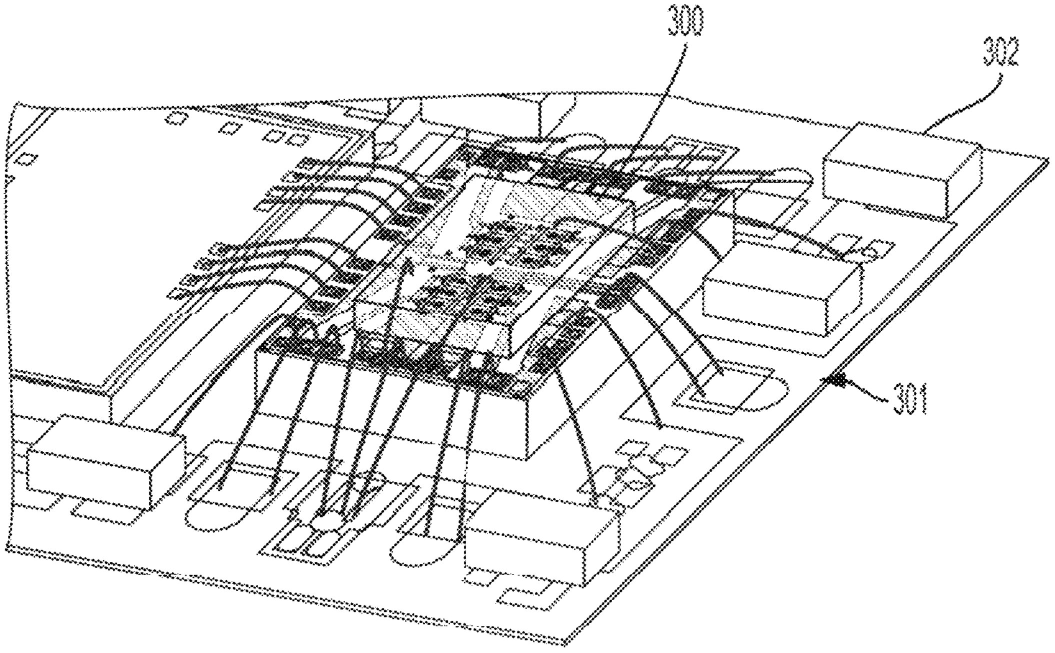
FIG. 3 is a schematic diagram of a MEMS die mounted on a printed circuit board, in accordance with some embodiments.
Figure 4:
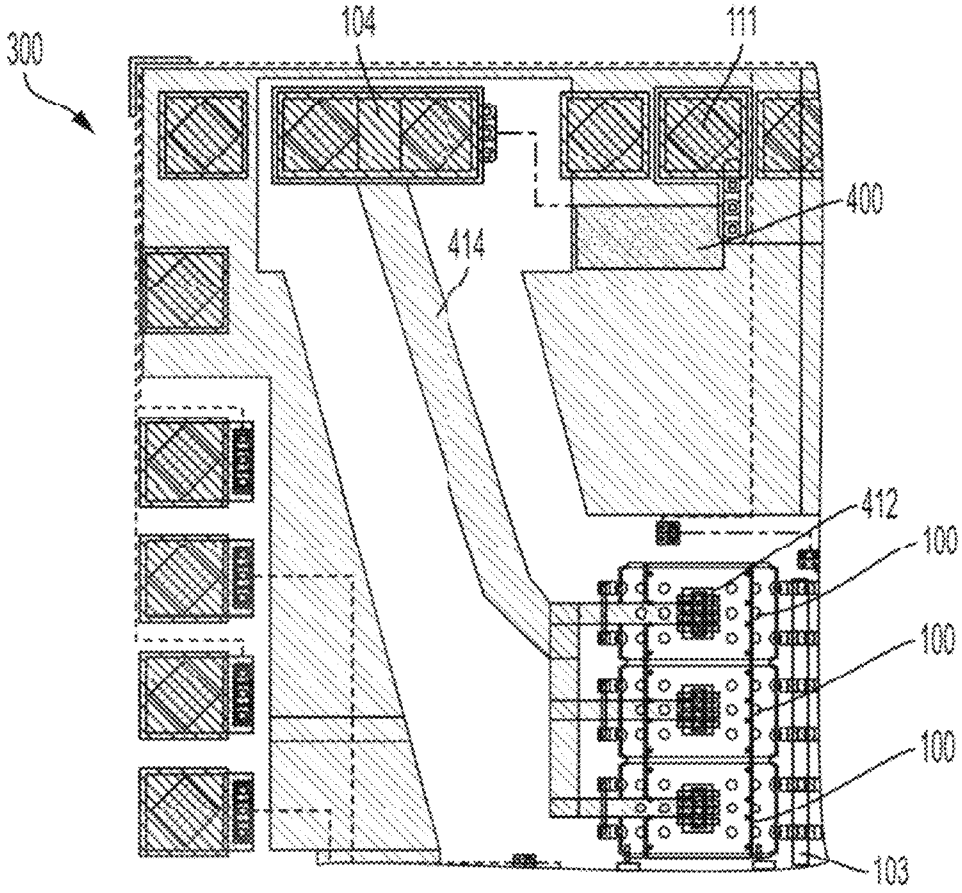
FIG. 4 is a circuit layout of an integrated circuit having a MEMS switch and a resistor, in accordance with some embodiments.

FIGS. 3-4 are schematic diagrams illustrating how the circuit of FIG. 2 may be implemented in practice, in accordance with some embodiments. In the arrangement of FIG. 3, a MEMS die 300 is mounted on and wire bonded to a printed circuit board (PCB) 301. MEMS die 300 is patterned with the MEMS switch of FIG. 2, and optionally with other MEMS devices. Resistor 302 acts as resistor 112 of FIG. 2 and is formed as a discrete component mounted on PCB 301 alongside MEMS die 300. On the other hand, in the arrangement of FIG. 4, a resistor 400 is monolithically integrated on MEMS die 300, where resistor 400 acts as resistor 112 of FIG. 2. FIG. 4 illustrates that resistor 400 is connected to a pad that is in turn connected to fixed electric potential 111. Further, resistor 400 is connected to a pad that is in turn connected to node 104. A trace 414 connects node 104 to multiple beams 100, each forming one respective MEMS switch. Hinges 412 connect each beam to an underlying anchor (not shown in FIG. 4).

Applicant has appreciated that co-integrating the charge bleed resistor on the same die hosting the MEMS switch leads to less capacitance and inductance relative to arrangements in which the resistor is a discrete component (as shown in FIG. 3), thus providing an impedance that is solely (or almost solely) resistive. This is because the resistor is connected to the MEMS switch via conductive traces, as opposed to wire bonds. Resistive paths are better than reactive paths in some embodiments because they dissipate electric charge more efficiently. In some embodiments, resistor 400 may be made of polysilicon and may be doped to provide the desired resistivity (e.g., between 1 KΩ/square and 3 KΩ/square). Benefits of the circuit configuration shown in FIG. 4 include simplicity of the MEMS device and reduced costs associated with fabricating devices having these configurations.

According to some embodiments of the present application, the charge bleed circuit may include a switch that allows for the impedance path to become connected and disconnected from the circuit node. This arrangement stems from applicant's appreciation that introducing an impedance path in a switch may impact the ability of the switch to operate at low voltages. This is because the impedance path forms an alternative path for electric charge, which may create a leakage path for a signal and negatively impact performance of the device at lower voltages. Applicant has appreciated that including a switchable device (e.g., a MEMS switch, a solid-state device switch, or a circuit implementing a device that can be turned on and off) that connects and disconnects the impedance path from a circuit node may allow the device to perform different types of measurements at desired performance levels. For example, when performing low voltage measurements, the switch may be open such that the impedance path is disconnected and has little to no impact on performance of the device. After the measurements are performed, the switch may be closed such that the impedance path is connected, allowing any parasitic charge accumulated on the circuit node to dissipate. Accordingly, some embodiments of the present application relate to charge bleed circuits that include a switchable device.

Figure 5B:
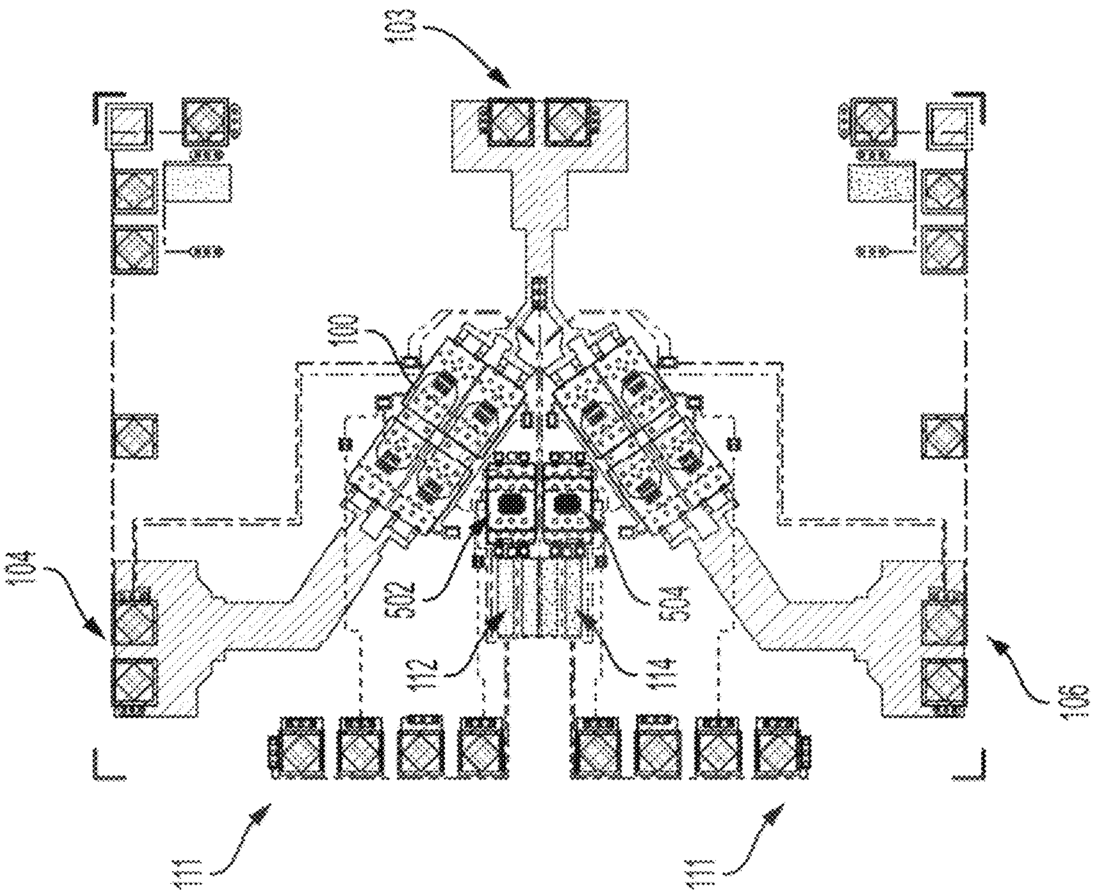
FIG. 5B is a circuit layout of an integrated circuit having a MEMS switch and switchable resistive charge bleed circuits, in accordance with some embodiments.
Figure 5A:
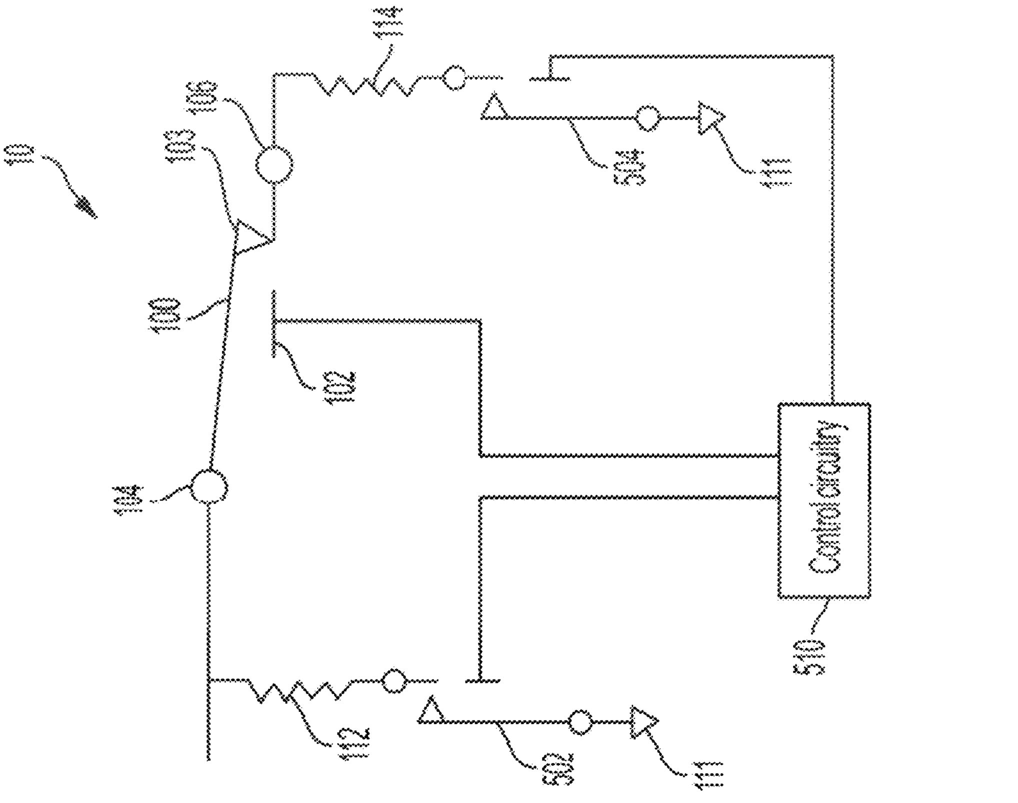
FIG. 5A is a schematic diagram of a MEMS switch having switchable resistive charge bleed circuits, in accordance with some embodiments.

FIG. 5A is a circuit diagram of an exemplary circuit having a MEMS switch and charge bleed circuits including switchable devices on either side of the MEMS switch. As in the example of FIG. 1B, MEMS switch 10 includes a beam 100, a gate electrode 102, an electrode 103, nodes 104 and 106, and resistors 112 and 114. Further, a MEMS switch 502 is added in series to resistor 112 and a MEMS switch 504 is added in series to resistor 114. MEMS switches 502 and 504 act as the switchable devices in this example. MEMS switches 502 and 504 may be implemented as cantilevered MEMS switches, teeter-totter MEMS switches, or any other type of MEMS switch. One side of switch 502 is coupled to resistor 112 and the other side of switch 502 is coupled to fixed electric potential 111. Similarly, one side of switch 504 is coupled to resistor 114 and the other side of switch 504 is coupled to fixed electric potential 111. When switches 502 and 504 are closed (in conductive states), the circuit nodes 104 and 106 are coupled to fixed electric potential 111. By contrast, when switches 502 and 504 are open (in non-conductive states), the circuit nodes 104 and 106 are floating. For example, when they are floating, the nodes are disconnected from any fixed electric potentials so that the potential present at the nodes is free to fluctuate depending upon the voltage applied to gate electrode 102 or the signals applied to the nodes.

In some embodiments, when switch 502 is closed, the same amount of electric current passes through switch 502 and resistor 112. Similarly, when switch 504 is closed, the same amount of electric current may pass through switch 504 and resistor 114. Control circuitry 510 may control the states of the switches of FIG. 5A. While the circuit of FIG. 5A represents a cantilevered MEMS switch, switchable resistive charge bleed circuits may be used in connection with other types of switches as well, including with teeter-totter MEMS switches.

In some embodiments, the MEMS switches and resistors in the charge bleed circuits may be monolithically integrated on the same die as the MEMS switch. FIG. 5B is a circuit layout showing a circuit in which switches 502 and 504 are monolithically co-integrated with the MEMS switch. FIG. 5B illustrates that resistor 112 is connected to a pad that is in turn connected to node 104. Further, resistor 112 is connected to a terminal of MEMS switch 502. The other terminal of MEMS switch 502 is connected to a pad that is in turn connected to fixed electric potential 111. Similarly, resistor 114 is connected to a pad that is in turn connected to node 106. Further, resistor 114 is connected to a terminal of MEMS switch 504. The other terminal of MEMS switch 504 is connected to another pad connected to fixed electric potential 111.

Figure 5C:
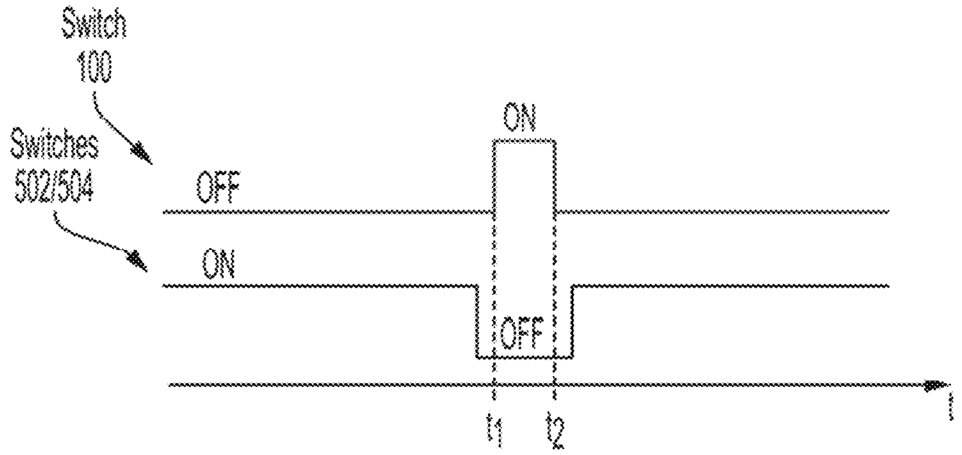
FIG. 5C is a time diagram illustrating control signals associated with the MEMS switch of FIG. 5A, in accordance with some embodiments.

As described above, control circuitry 510 may control the states of the switches of FIG. 5A. FIG. 5C is a time diagram illustrating control signals for controlling the states of the switches of FIG. 5A, in accordance with some embodiments. Control circuitry 510 may generate these signals. In FIG. 5C, the control signal shown on the upper portion of the figure controls MEMS switch 10 and the control signal shown on the lower portion of the figure controls switches 502 and 504. The control signals are represented so that, in the OFF state, the corresponding switch(es) is open and, in the ON state, the corresponding switch(es) is closed. In some embodiments, control circuitry 510 is configured to maintain the bleeding switches in a non-conductive (OFF) state during a time interval in which the MEMS switch is in a conductive (ON) state. For example, in FIG. 5C, MEMS switch 10 is turned ON at time $t_1$ and is turned OFF at $t_2$, while switches 502 and 504 are turned OFF before (or at) $t_1$ and are turned ON after (or at) $t_2$. Thus, the control circuitry is configured to maintain switches 502 and 504 decoupled from the fixed electric potential 111 when MEMS switch 10 is in a conductive state (which in this example occurs in the time interval defined between t1 and t2). When MEMS switch 10 is in a non-conductive state (or at least for a portion of the time in which MEMS switch 10 is in a non-conductive state), the control circuitry is configured to maintain switches 502 and 504 coupled to the fixed electric potential 111. It should be noted that switches 502 and 504 need not be in the non-conductive state for the entire duration of the intervals in which MEMS switch 10 is in the conductive state. In some embodiments, for example, switches 502 and 504 are in the non-conductive state for only a portion of the interval defined between $t_1$ and $t_2$.

In some embodiments, the switchable devices may be kept in the conductive states when MEMS switch 10 is in the conductive state. Operating the device in this way allows the circuit to perform very low-voltage measurements. Thus, in some embodiments, the control circuitry configured to maintain one or more of the switchable devices coupled to the fixed electric potential when the MEMS switch 10 is in a conductive state.

Figure 6:
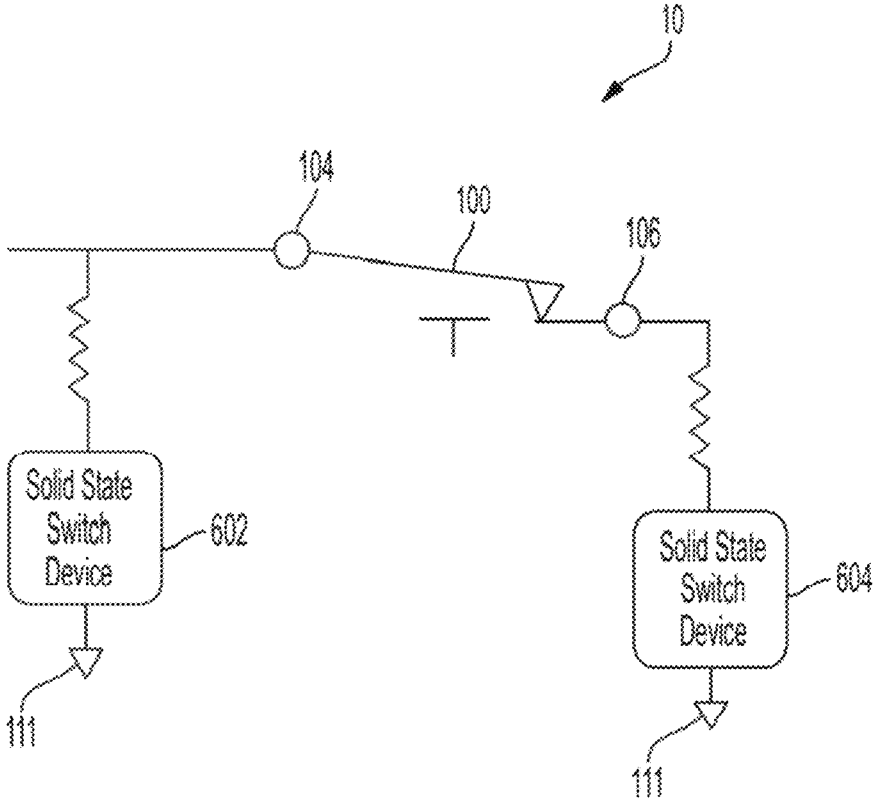
FIG. 6 is a schematic diagram of a MEMS switch having switchable resistive charge bleed circuits including solid state switch devices, in accordance with some embodiments.
Figure 7B:
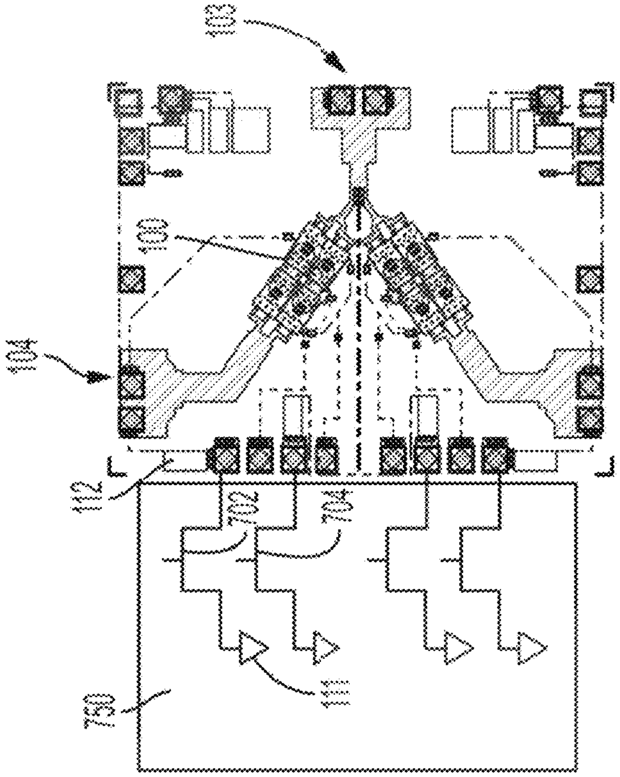
FIG. 7B is a circuit layout of a MEMS switch having switchable resistive charge bleed circuits including transistors, in accordance with some embodiments.
Figure 7A:
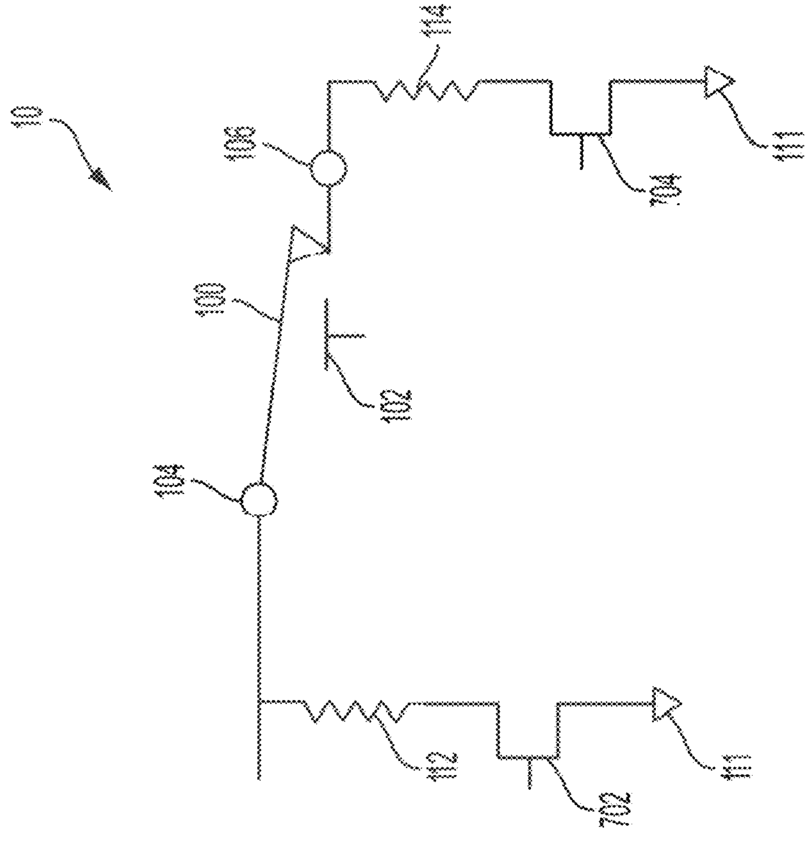
FIG. 7A is a schematic diagram of a MEMS switch having switchable resistive charge bleed circuits including transistors, in accordance with some embodiments.

In some embodiments, the switchable devices may include solid-state device switches. FIG. 6 shows an example of a circuit having charge bleed circuits that include solid-state device switches 602 and 604. Examples of solid-state device switches include field effect transistors (FETs) (e.g., metal-oxide semiconductor FET (MOSFET), diodes, and bipolar junction transistors (BJTs). An example of such a configuration is depicted in FIG. 7A, in which the solid state switch devices are implemented with MOSFETs 702 and 704. The states of MEMS switch 10 and transistors 702 and 704 may be controlled in the same manner described in connection with FIG. 5C. Accordingly, control circuitry (not shown in FIG. 7A) similar to control circuitry 510 may be coupled to gate electrode 102 and the gates (or bases) of the transistors.

In some embodiments, a resistor of the charge bleed circuit may be located on the same die as the MEMS switch and a separate die may include the transistors. An example of such a configuration having a separate die including transistors is shown in FIG. 7B. In this example, MEMS switch 10 is on one die and transistors 702 and 704 are on die 750. Resistor 112 is connected between transistor 702 and node 104.

By contrast, in other embodiments, the solid-state device switches may be located on a die that is stacked over the die hosting the MEMS switch. An example of such a stacked die configuration is shown in FIG. 8A. In this example, die 300 hosts the MEMS switch and die 800 hosts the transistors and is stacked on top of die 300. Die 800 may be wire bonded to die 300.

Figure 8B:
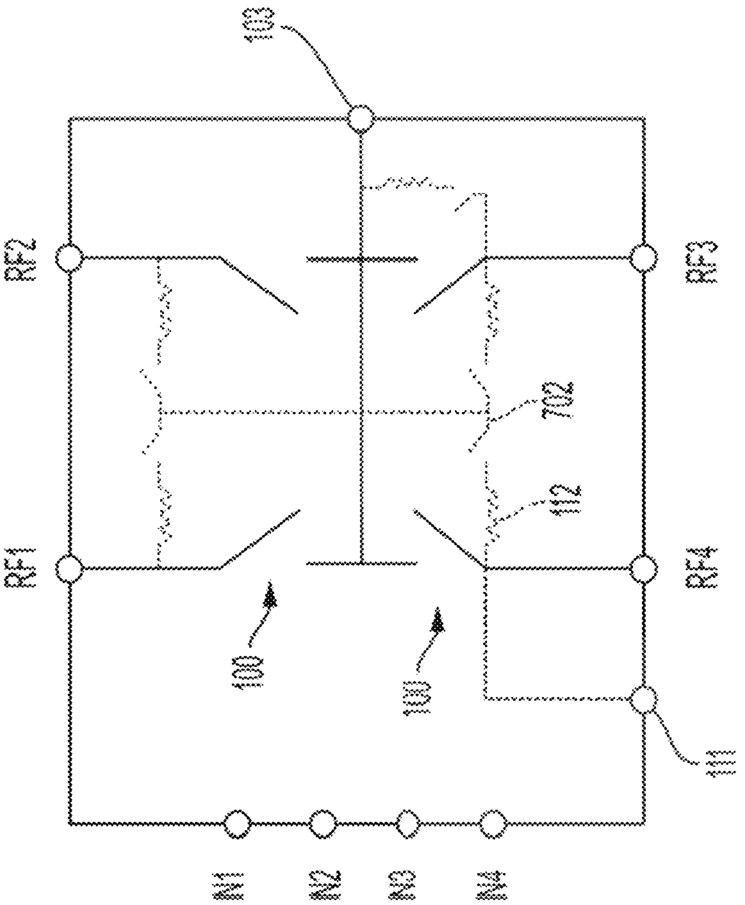
FIG. 8B is a circuit diagram of a MEMS chip having switchable resistive charge bleed circuits including transistors, in accordance with some embodiments.
Figure 8A:
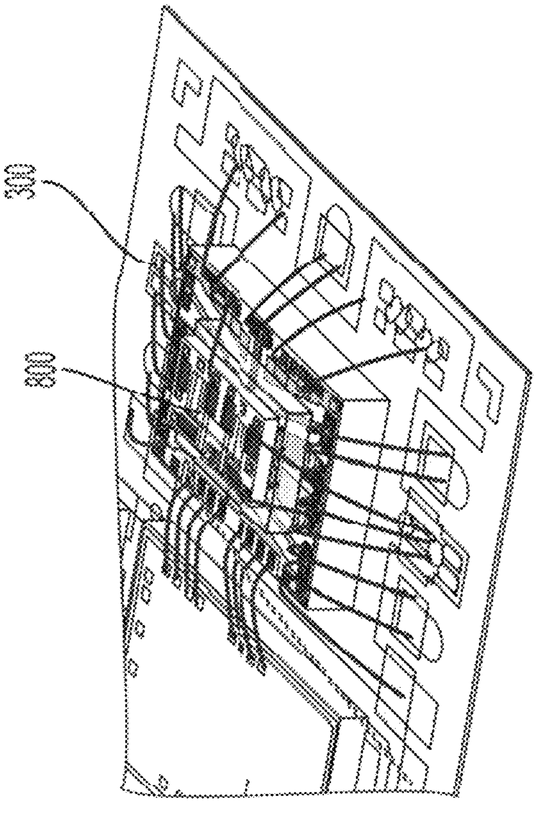
FIG. 8A is a schematic diagram of a MEMS die mounted on a printed circuit board, in accordance with some embodiments.

FIG. 8B is a circuit diagram of a representative integrated circuit (IC) including four MEMS switches, in accordance with some embodiments. The IC further incudes switchable resistive charge bleed circuits including transistors. In some embodiments, the transistors and resistors of the IC are formed on die 800 and the MEMS switches are formed on die 300. As shown in FIG. 8B, each MEMS switch is accessible from a respective input terminal of the IC (RF1, RF2, RF3 and RF4). Terminal 103 represents a common output node. Terminal 111 is coupled to a fixed electric potential. In this example, there are five transistors 702 and five resistors 112. Each transistor is in series with a respective resistor. Each transistor/resistor pair forms a charge bleed circuit to the fixed electric potential via terminal 111.

Figure 9:
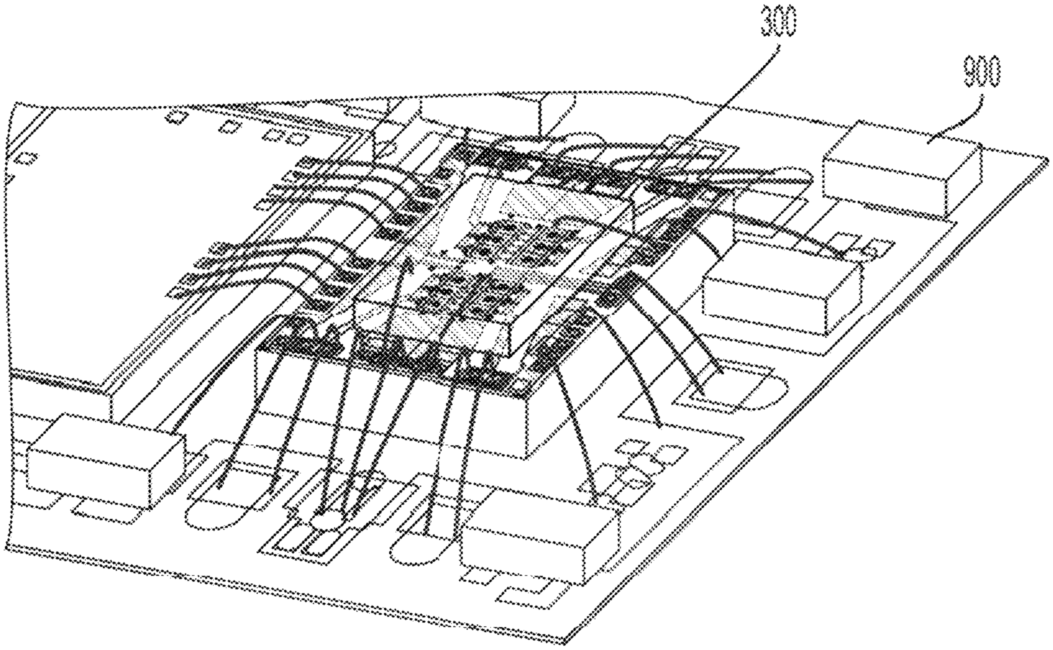
FIG. 9 is a schematic diagram of another MEMS die mounted on a printed circuit board, in accordance with some embodiments.

In some embodiments, the solid-state device switches may be discrete components, and may co-packaged with the die hosting the MEMS switch. An example of discrete solid-state device switch configuration is shown in FIG. 9. Device 900, which includes the solid-state device switches, is formed as a separate die relative to die 300.

Figure 10B:
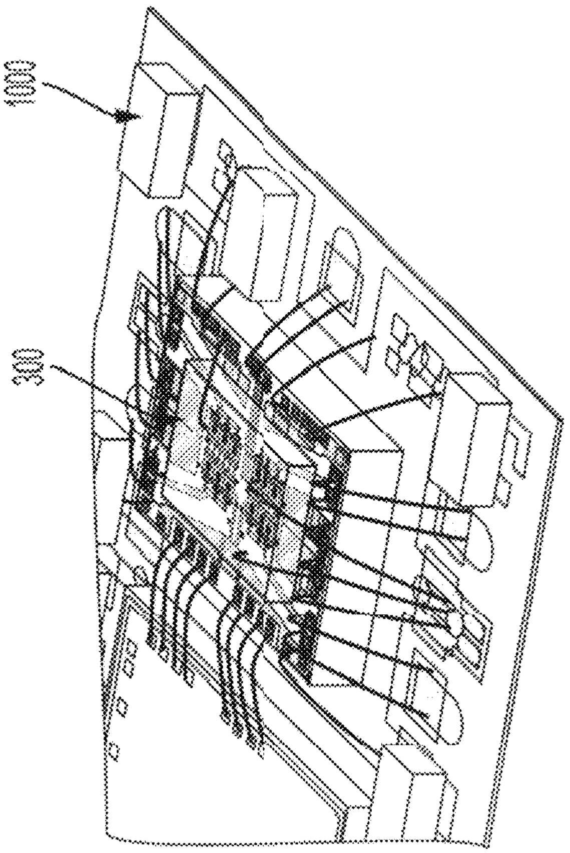
FIG. 10B is a schematic diagram of another MEMS die mounted on a printed circuit board, in accordance with some embodiments.
Figure 10A:
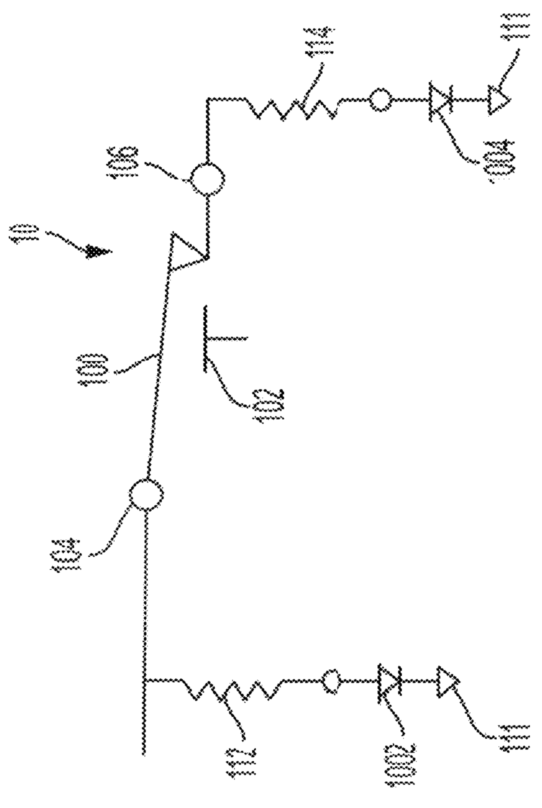
FIG. 10A is a schematic diagram of a MEMS switch having switchable resistive charge bleed circuits including diodes, in accordance with some embodiments.

In some embodiments, a charge bleed circuit may include a diode that acts as a switch to connect and disconnect an impedance path. The diode may be biased at a first voltage to open the impedance path and may be biased at a second voltage to close the impedance path. For example, the diode may be biased outside a particular signal range to open the impedance path and biased to ground to close the impedance path. In the arrangement of FIG. 10A, diodes 1002 and 1004 are connected in series with resistors 112 and 114, respectively. In this example, diodes 1002 and 1004 act as the switchable devices. The diode cathodes are coupled to fixed electric potential 111. Depending on the magnitude of the bias potential, the diodes may allow current to flow through them or not. The magnitude of the bias potential may be set using control circuitry (not shown in FIG. 10A). The diodes may be discrete diodes, such as in the example configuration shown in FIG. 10B. In this example, device 1000, which includes diodes 1002 and 1004, is mounted to PCB 301 alongside MEMS die 300. In other embodiments, the diodes may be monolithically integrated on a die stacked over the MEMS die. An example of a monolithically stacked diode die is shown in FIG. 11A, in which die 1100, including diodes 1002 and 1004, is stacked on top of die 300.

Figure 11B:
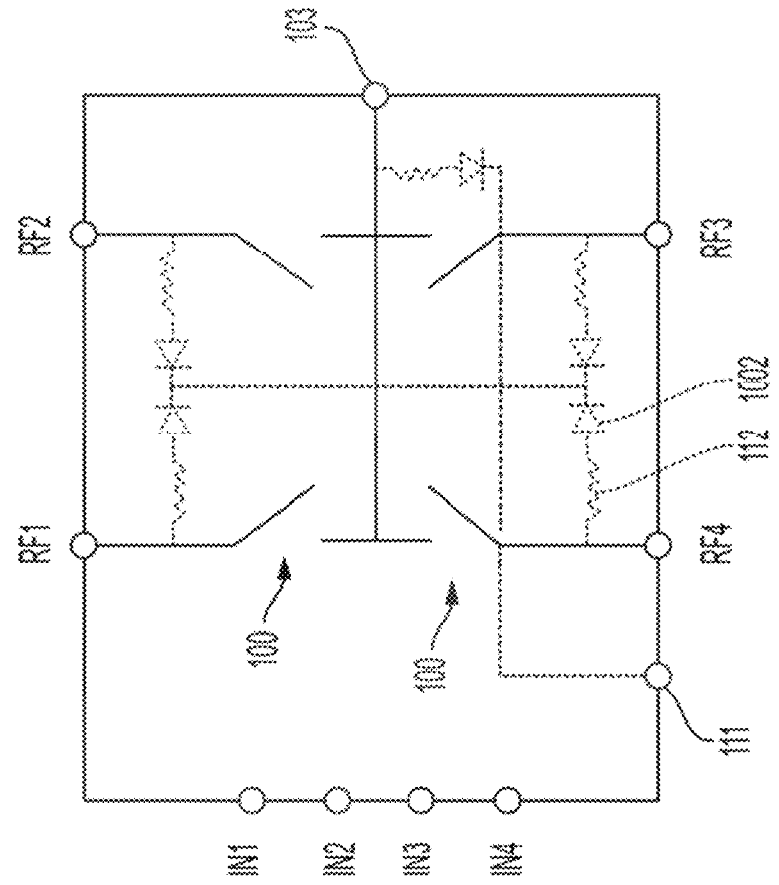
FIG. 11B is a circuit diagram of a MEMS chip having switchable resistive charge bleed circuits including diodes, in accordance with some embodiments.
Figure 11A:
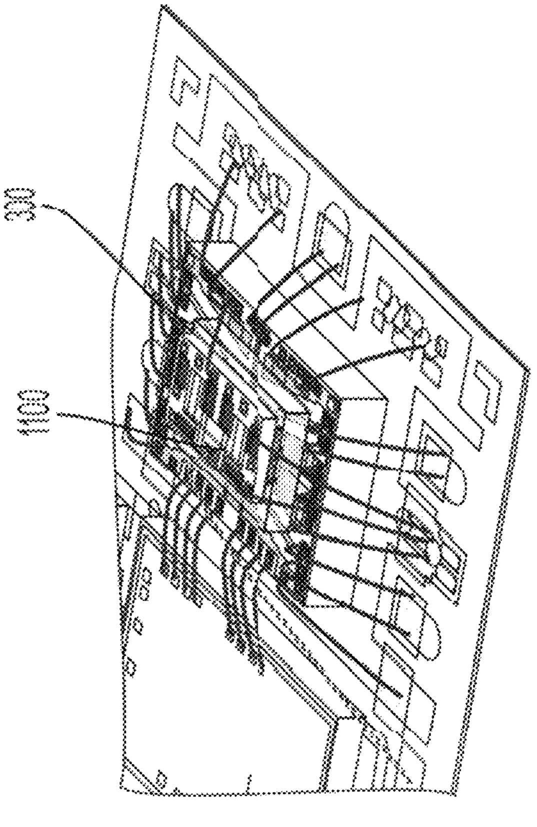
FIG. 11A is a schematic diagram of another MEMS die mounted on a printed circuit board, in accordance with some embodiments.

FIG. 11B is a circuit diagram of a representative IC including four MEMS switches, in accordance with some embodiments. The IC further incudes switchable resistive charge bleed circuits including diodes. In some embodiments, the diodes and resistors of the IC are formed on die 1100 and the MEMS switches are formed on die 300. As further shown in FIG. 11B, each MEMS switch is accessible from a respective input terminal of the IC (RF1, RF2, RF3 and RF4). Terminal 103 represents a common output node. Terminal 111 is coupled to a fixed electric potential. In this example, there are five diodes 1002 and five resistors 112. Each diode is in series with a respective resistor. Each diode/resistor pair forms a charge bleed circuit to the fixed electric potential via terminal 111.

Figure 12B:
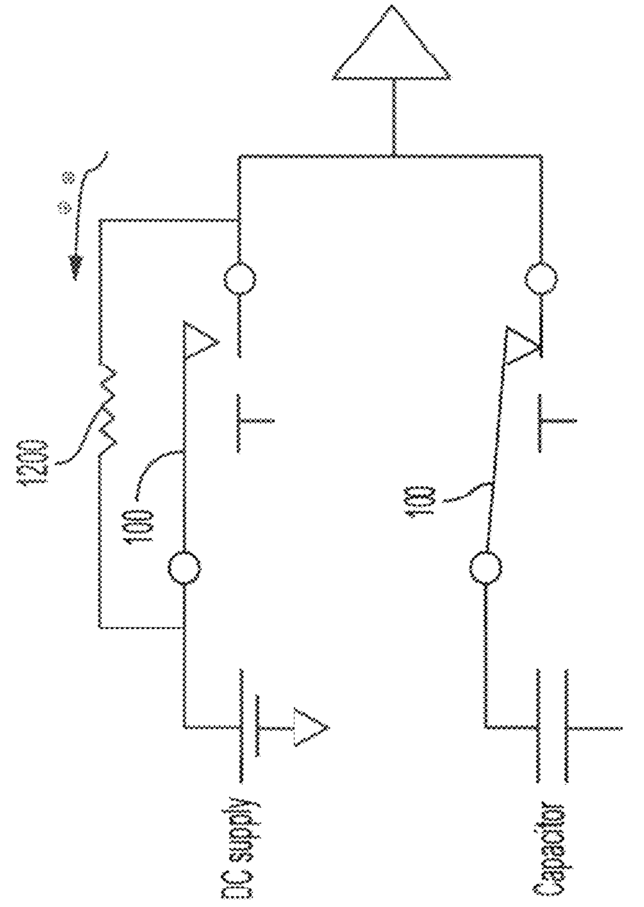
FIG. 12B is a schematic diagram of a pair of MEMS switches having a resistive charge bleed circuit positioned between the terminals of one of the MEMS switches, in accordance with some embodiments.
Figure 12A:
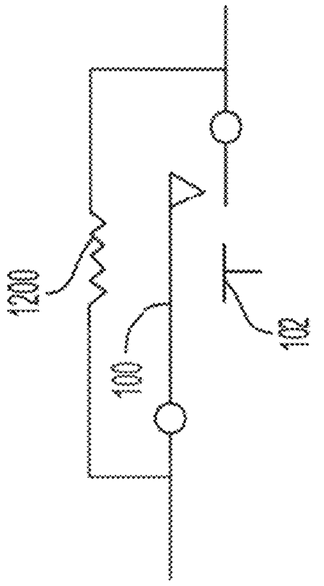
FIG. 12A is a schematic diagram of a MEMS switch having resistive charge bleed circuit positioned between the terminals of the MEMS switch, in accordance with some embodiments.

In some embodiments, an impedance path connects to circuit nodes on both sides of a MEMS switch. In such embodiments, a resistor of the impedance path is parallel to the MEMS switch. FIG. 12A shows examples where a resistor 1200 is placed in parallel with a MEMS switch 10, between an input and an output of the MEMS switch. These impedance paths connect the circuit nodes such that they are no longer floating, allowing for charge that would otherwise accumulate at these nodes to dissipate. One of the benefits of this type of circuit configuration is that no additional power supply is needed to control the impedance path. This may lead to simplicity of its use in operation as a user does not need to configure the impedance path for particular uses of the MEMS device. FIG. 12B shows a circuit having a pair of MEMS switches 10, with a resistor 1200 placed in parallel to one of the switches. The outputs of the MEMS switches are connected to a common output node, which in turn is connected to a load. The input of the MEMS switch coupled in parallel to resistor 100 is coupled to a DC supply. The input of the other MEMS switch is coupled to a capacitor. In some embodiments, the circuit may be operated so that one MEMS switch is OFF when the other is MEMS switch is ON, and vice versa. When the MEMS switch coupled in parallel to resistor 1200 is ON, charge accumulating at the switch output node is discharged back to the power supply. When the other MEMS switch is ON, the switch output node is also discharged, and no additional leakage is provided, thereby enabling ultra-low voltage measurements.

In some embodiments, a parallel impedance path may be implemented in automatic test equipment (ATE) configurations. ATE is any electronic apparatus that performs tests on a device, known as the device under test (DUT), using some degree of automation. ATE is widely used in the electronic manufacturing industry to test electronic components and systems once they have been fabricated. ATE is also commonly used to test transceivers in communication networks.

Figure 12C:
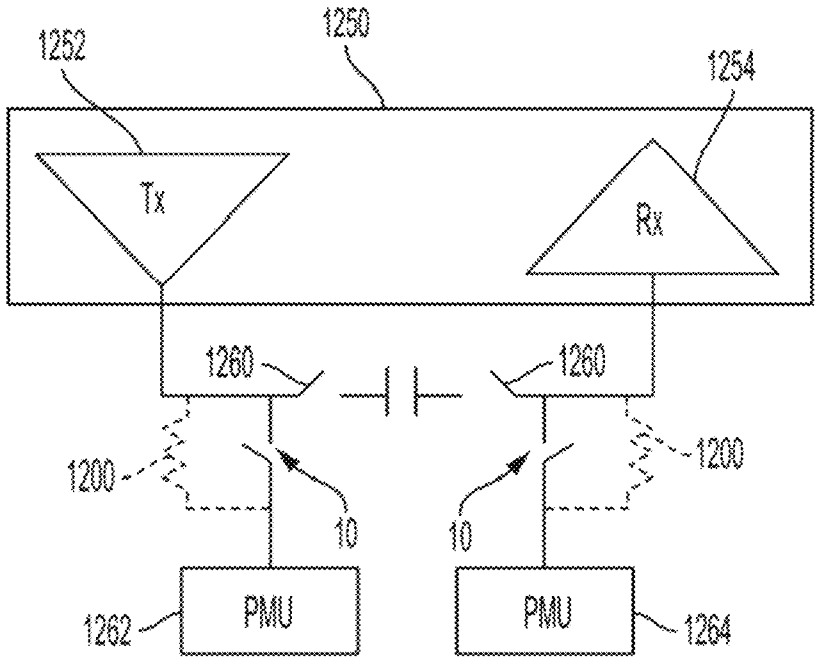
FIG. 12C is a circuit diagram showing MEMS switches used in automatic test equipment (ATE), in accordance with some embodiments.

FIG. 12C shows an example configuration of a setup to test a transceiver 1250, in accordance with some embodiments. Transceiver 1250 includes a transmitter (TX) 1252 and a receiver (RX) 1254. A pair of switches 1260 connect and disconnect the path that connects TX 1252 directly with RX 1254. In some embodiments, switches 1260 are controlled using the same signal, and as a result, have the same state. TX 1252 is coupled to a first parametric measurement unit (PMU) 1262 via a MEMS switch 10, which in some embodiments may be arranged as a single-pole single-throw (SPST) switch—a switch that has a single input and a single output. Similarly, RX 1254 is coupled to a second PMU 1264 via a MEMS switch 10, which in some embodiments may be arranged as an SPST switch. When a MEMS switch 10 is in the conductive state, measurements in connection with the respective portion of the transceiver (the TX or the RX) are enabled. Resistors 1200 are in parallel to the MEMS switches. The resistors prevent charge build up on a floating node of the switches. When a switch switches from DC test to RF test by disconnecting the DC path and connecting the RF path, a charge built up on a node of the switch is discharged through the resistor.

The configurations described in connection with FIGS. 5A-12C can be used in conjunction with MEMS switches other than cantilevered MEMS switches, including for example with teeter-totter MEMS switches. As for cantilevered MEMS switches, charge accumulation may be particularly severe in teeter-totter MEMS switches given the relatively high voltage (e.g., between 60V and 100V) often used to actuate the beam.

Figure 13:
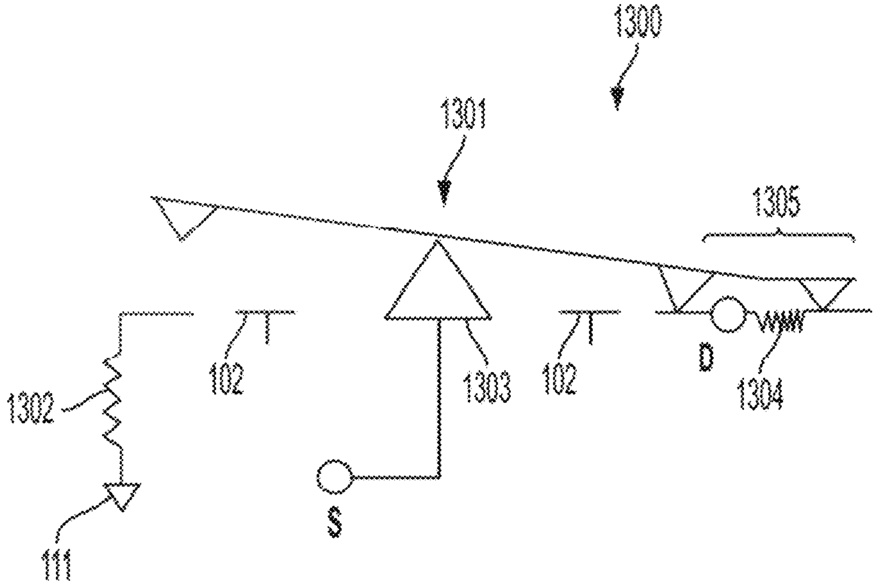
FIG. 13 is a schematic diagram of a teeter-totter MEMS switch having resistive charge bleed circuits, in accordance with some embodiments.
Figure 14B:
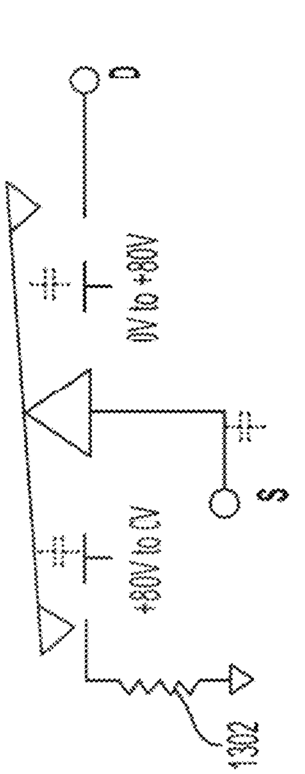
FIGS. 14A-14D illustrate a switching sequence of a teeter-totter MEMS switch, in accordance with some embodiments.
Figure 14D:
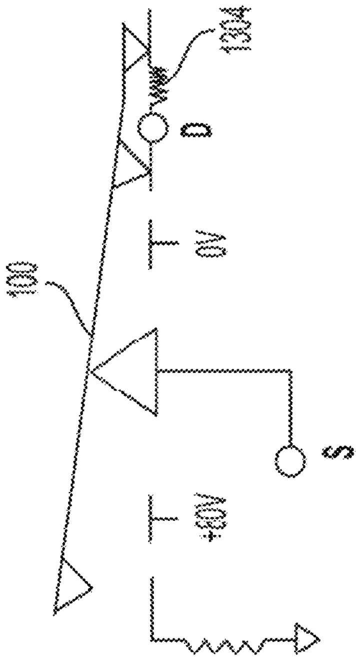
Figure 14A:
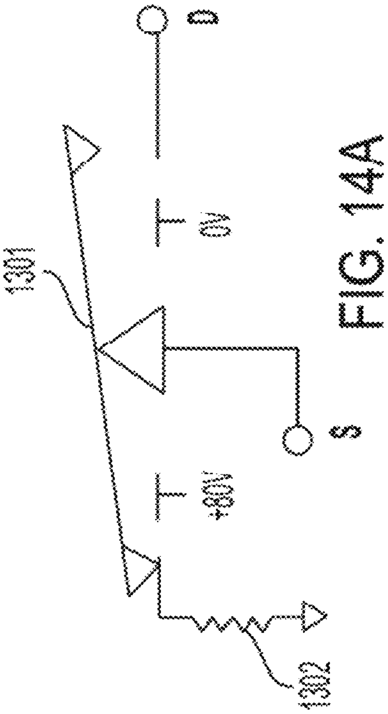
Figure 14C:
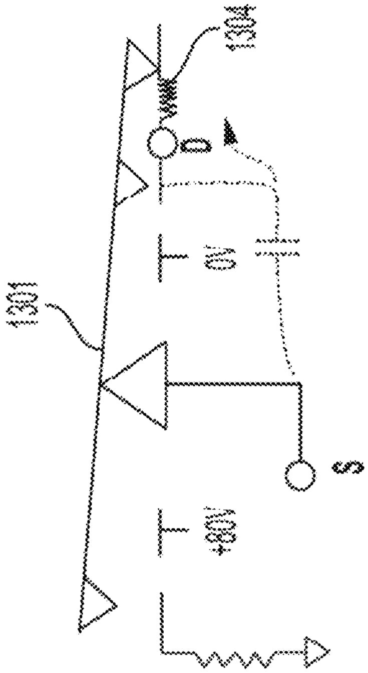

FIG. 13 illustrates a teeter-totter MEMS switch 1300 including resistive charge bleed circuits, in accordance with some embodiments. Teeter-totter MEMS switch 1300 includes a beam 1301 attached to the underlying substrate through an anchor 1303. The orientation of the beam is controlled using gate electrodes 102. Application of a voltage to one of the gate electrodes causes the beam portion positioned above that gate electrode to move towards the substrate via electrostatic attraction, thus causing the beam to tilt towards that gate electrode. Thus, the teeter-totter MEMS switch can be in one of two states: one state in which the beam contacts the drain (D) terminal (referred to as the ON state, as shown in FIG. 13), and one state in which the beam contacts the opposite terminal (referred to as the OFF state). In the ON state, an electric path is formed between the source (S) terminal and the drain terminal that passes through anchor 1303. The terminal positioned opposite from the drain terminal is coupled to fixed electric potential 111 via resistor 1302, which forms a resistive charge bleed circuit. The resistance of the resistor 1302 may be suitably large (e.g., ~10 MΩ) to reduce leakage of signal through the resistor during operation. In the OFF state, resistor 1302 couples the beam to the fixed electric potential. In some embodiments, the switch may further include an extension portion 1305 coupled to an end of the beam. The extension portion 1305 may be designed so that the beam contacts the drain terminal after the extension portion contacts the terminal below the extension portion. These two terminals may be connected to one another via resistor 1304. In this way, charged accumulated on the beam can be discharged through resistor 1304. The resistance of the resistor may be suitably large (e.g., ~100KΩ, 1 MΩ) to reduce leakage of signal through the resistor during operation. Such a configuration may be referred to as a "self-bleeding switch" as charge may be dissipated as the side of the beam contacts the two circuit terminals.

FIGS. 14A-14D illustrate a switching sequence associated with the MEMS switch of FIG. 13, in accordance with some embodiments. In the step depicted in FIG. 14A, application of 80V to one of the gate electrodes places the switch is in the OFF state. The other gate electrode is held to 0V. Here, resistor 1302 ensures the charge accumulated on the beam is bled off to the fixed electric potential. In the step depicted in FIG. 14B, the voltages applied to the gate electrodes are inverted. Thus, one gate electrode transitions from 80V to 0V and the other gate electrodes transitions from 0V to 80V. As a result, the beam begins to tilt in the opposite orientation. During the transition from the OFF state to the ON state, the beam is floating and parasitic capacitances are formed between the beam and the gate electrodes. These capacitances lead to charge accumulation on the beam, which can negative impact (e.g., increase) the electrostatic force needed to switch the beam. In the step depicted in FIG. 14C, the extension portion contacts the underlying terminal, thus discharging the charge accumulated on the beam through resistor 1304. Finally, in the step depicted in FIG. 14D, the beam contacts the drain terminal. In this position, because the extension portion continues to contact the underlying terminal, low leakage measurements are enabled so long as the source terminal continues to be driven with a voltage.

Figure 15:
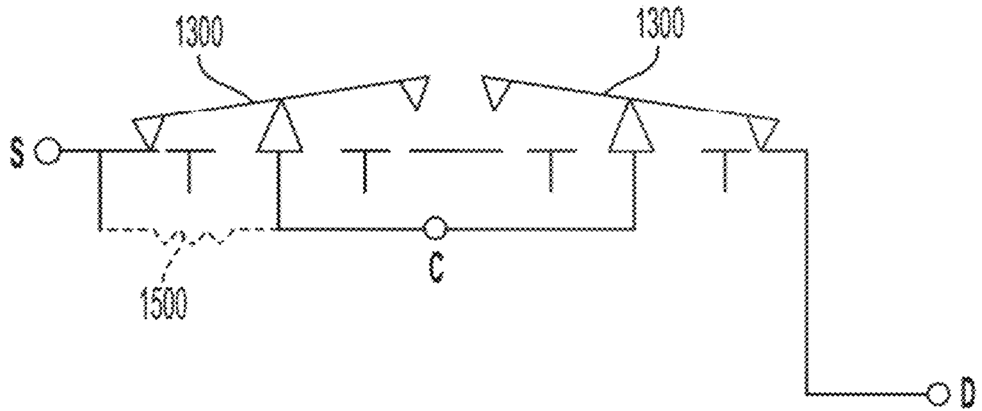
FIG. 15 is a schematic diagram of a pair of teeter-totter MEMS switches, in accordance with some embodiments.

In some embodiments, two or more teeter-totter MEMS switches may be positioned in series, as shown in the example of FIG. 15. Such a configuration may have a floating circuit node where charge may build-up. An impedance path may be formed by connecting a resistor 1500 in parallel with one of the MEMS switches, which may reduce or prevent charge accumulation. According to some embodiments, the resistor connects an input of one switch (S) to a point between the two switches (C).

Figure 16A:
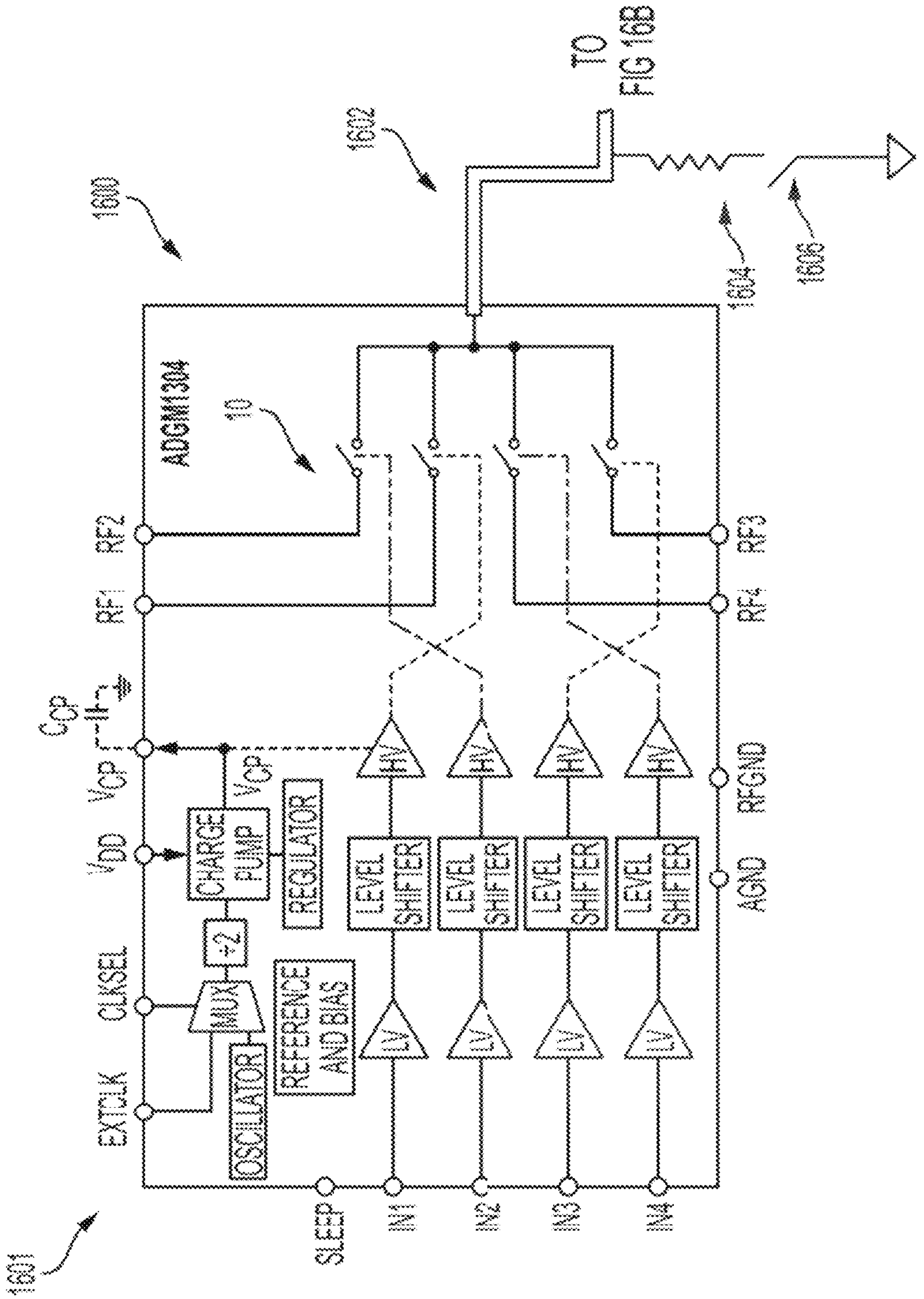
FIGS. 16A-16B form a circuit diagram illustrating a pair of MEMS switch chips mounted on a printer circuit board, in accordance with some embodiments.
Figure 16B:
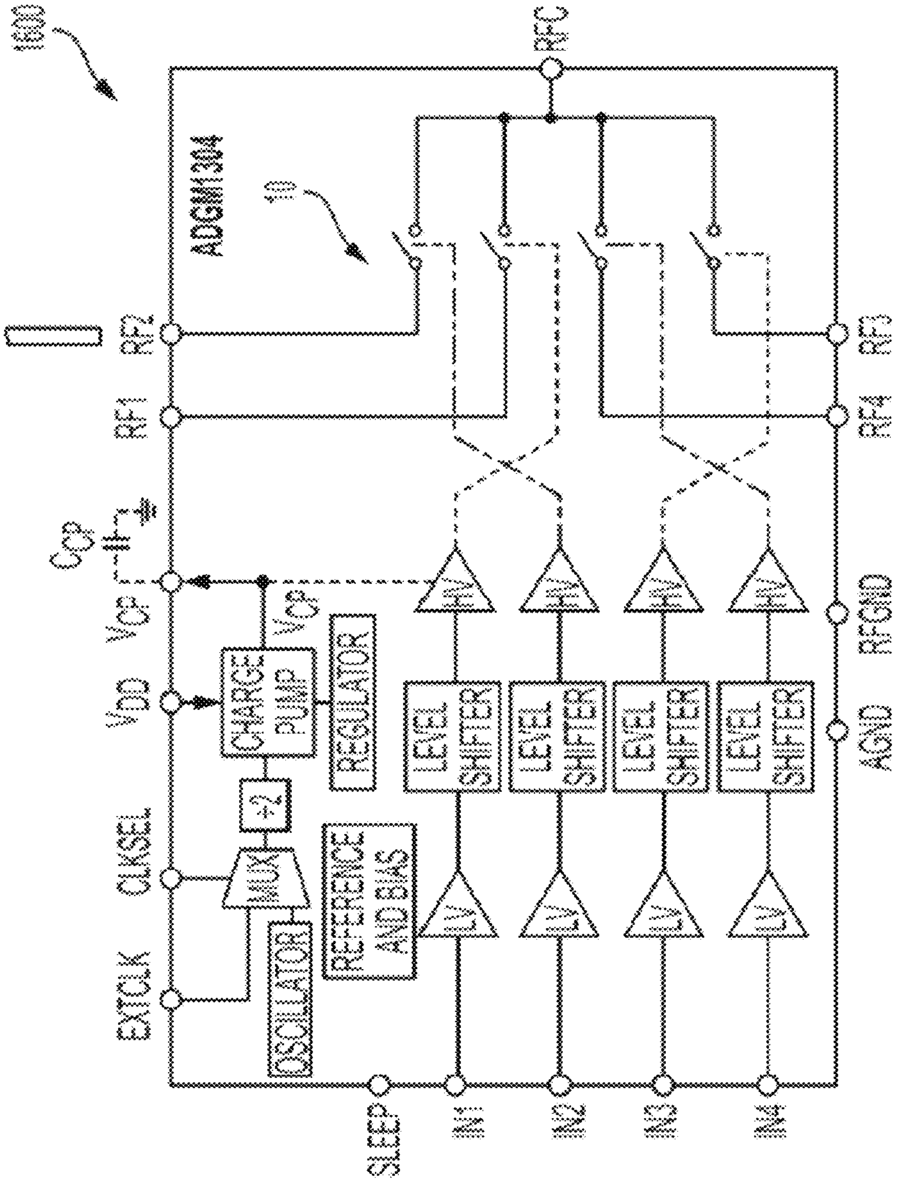

Switched charge bleeding circuits of the types described herein may be implemented on a printed circuit board (PCBs), in some embodiments. An example of a PCB level implementation is shown in FIG. 16. In this example, two representative MEMS switch ICs 1600 are mounted on a PCB 1601. The representative MEMS switch ICs of this example are Part No. ADGM1304, manufactured by Analog Devices, Inc. Each IC includes four MEMS switches 10, among other components. The switches can be accessed from separate input terminals (RF1, RF2, RF3 and RF 4) and share a common output terminal (RFC). It should be noted that other types of MEMS switch ICs can be used in the arrangement of FIG. 16. A PCB trace 1602 connects the two ICs together. In this example, the output terminal of one IC is connected to one of the input terminals of the other IC. In some embodiments, a charge bleed circuit may be connected between the PCB trace and a fixed electric potential to dissipate charge that may otherwise accumulate on the sides of the MEMS switches. In this example, the charge bleed circuit includes a resistor 1604 in series with a switchable device 1606. The switchable device may be implemented using MEMS switches (e.g., cantilevered or teeter-totter) or solid-state switch devices, examples of which are described above.

Figure 17:
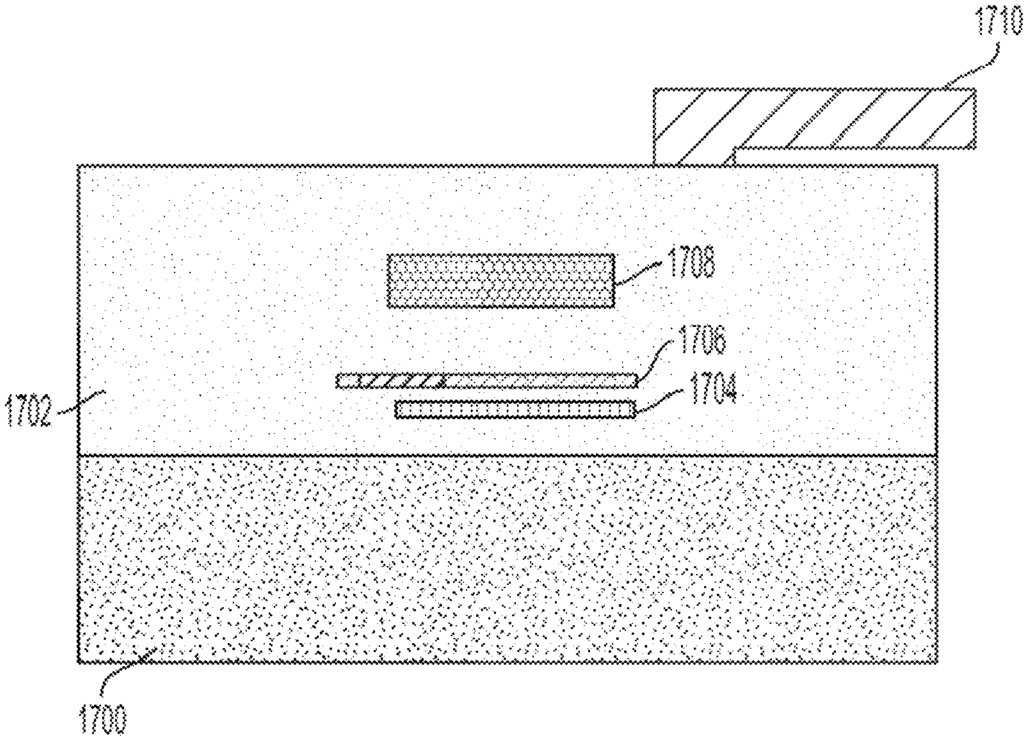
FIG. 17 is a cross sectional view of a MEMS substrate, in accordance with some embodiments.

As described above, some solid-state switch devices may be co-fabricated monolithically with MEMS switches. In some embodiments, co-integration may be achieved using polysilicon-on-MEMS processes—processes that enable growth or deposition of polysilicon layers alongside MEMS structures on the same chip. In some embodiments, polysilicon layers may be formed within an oxide layer, as shown in FIG. 17. FIG. 17 is a cross section of a silicon substrate having a silicon handle 1700, an oxide layer 1702, a pair of polysilicon layers (1704 and 1706) embedded in the oxide layer, an aluminum layer 1708 also embedded in the oxide layer, and a MEMS layer 1710 formed on top of the oxide layer. The MEMS layer may be patterned to form a beam, such as a cantilevered beam of a teeter-totter beam. In some embodiments, the polysilicon layers and the aluminum layer may be patterned to form solid-state switch devices of the types described herein. Examples of such devices are shown in FIGS. 18A-18C, in accordance with some embodiments.

Figure 18A:
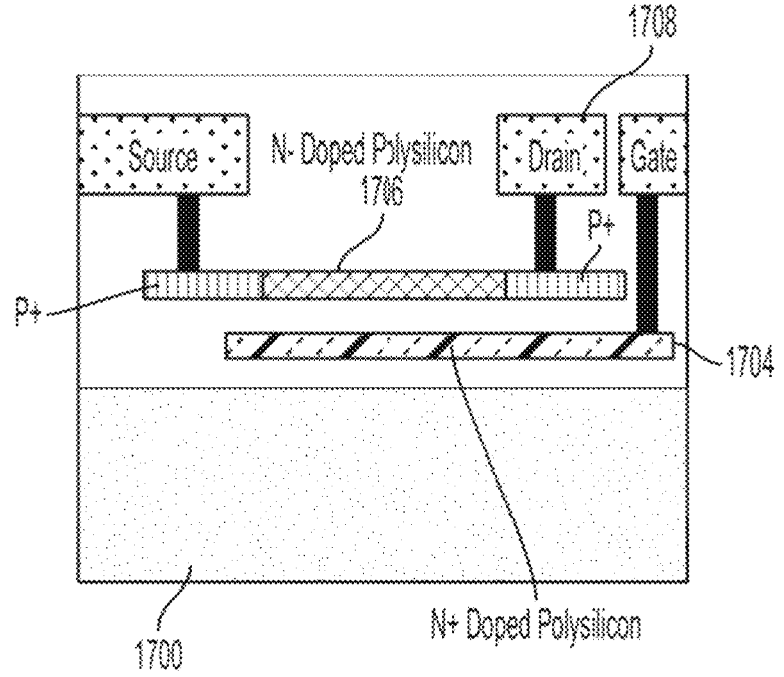
FIG. 18A is a cross sectional view of a transistor, in accordance with some embodiments.

The device of FIG. 18A includes a MOSFET. Polysilicon layer 1704 is $N^+$ doped. Polysilicon layer 1706 is $N^-$ doped in the channel region, and is $P^+$ doped in the ohmic contact regions. The source, gate and drain terminals are formed by patterning aluminum layer 1708. The gate terminal is connected to polysilicon layer 1704 and the drain and source terminals are connected to the $P^+$ doped regions of polysilicon layer 1706.

Figure 18B:
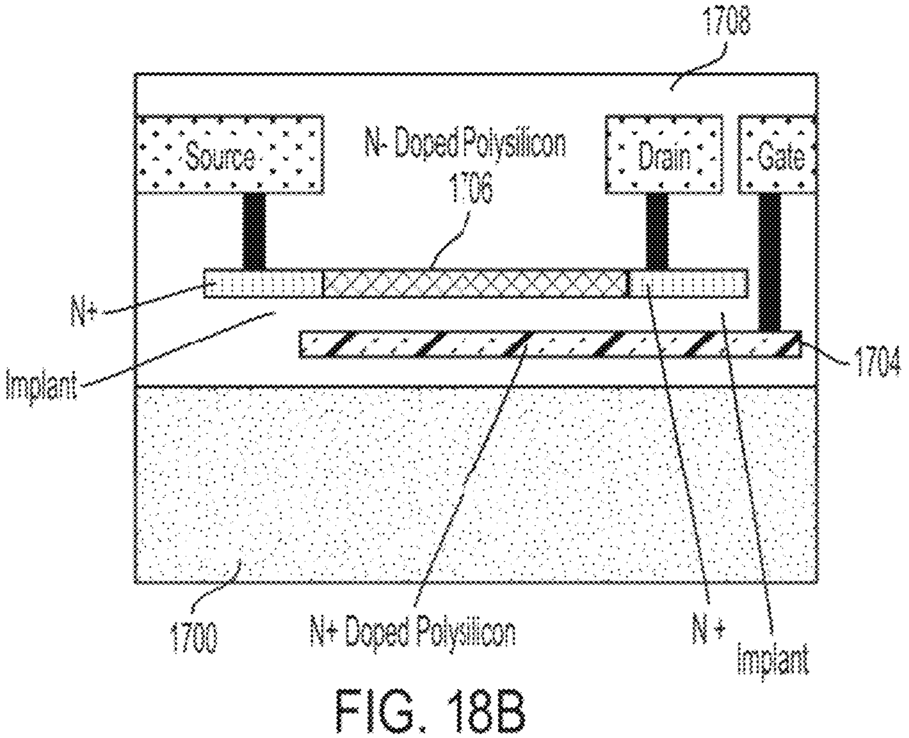
FIG. 18B is a cross sectional view of a depletion mode resistor, in accordance with some embodiments.

The device of FIG. 18B includes a depletion mode resistor. Polysilicon layer 1704 is $N^+$ doped. Polysilicon layer 1706 is $N^-$ doped in the channel region, and is $N^+$ doped in the ohmic contact regions. The source, gate and drain terminals are formed by patterning aluminum layer 1708. The gate terminal is connected to polysilicon layer 1704 and the drain and source terminals are connected to the $N^+$ doped regions of polysilicon layer 1706.

Figure 18C:
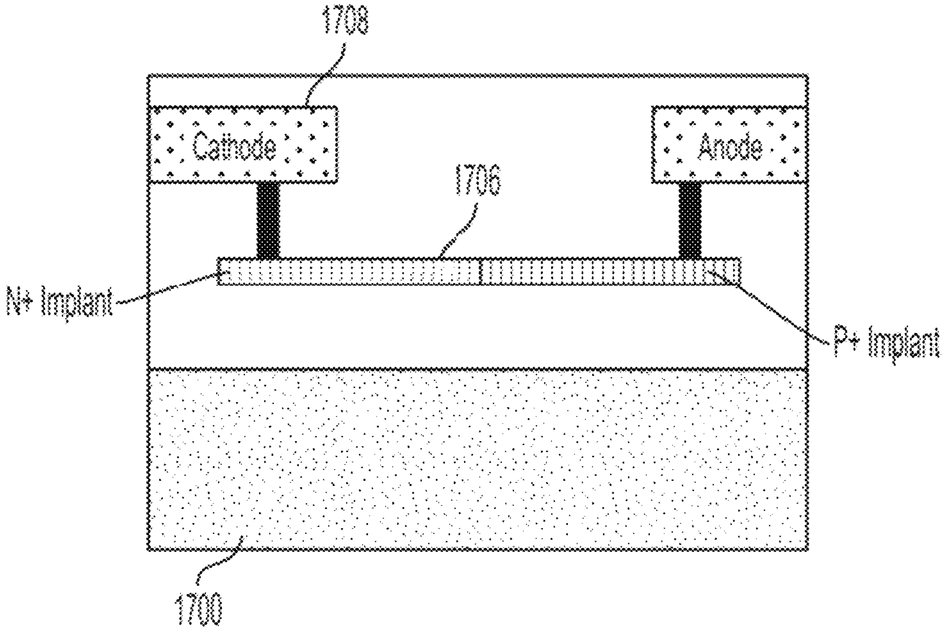
FIG. 18C is a cross sectional view of a diode, in accordance with some embodiments.

The device of FIG. 18C includes a diode. Polysilicon layer 1706 is $N^+$ doped in part and $P^+$ doped in part, thereby forming a PN junction. The anode and cathode terminals are formed by patterning aluminum layer 1708. The cathode terminal is connected to the $N^+$ doped region and the anode terminal is connected to $P^+$ doped region.

Figure 19:
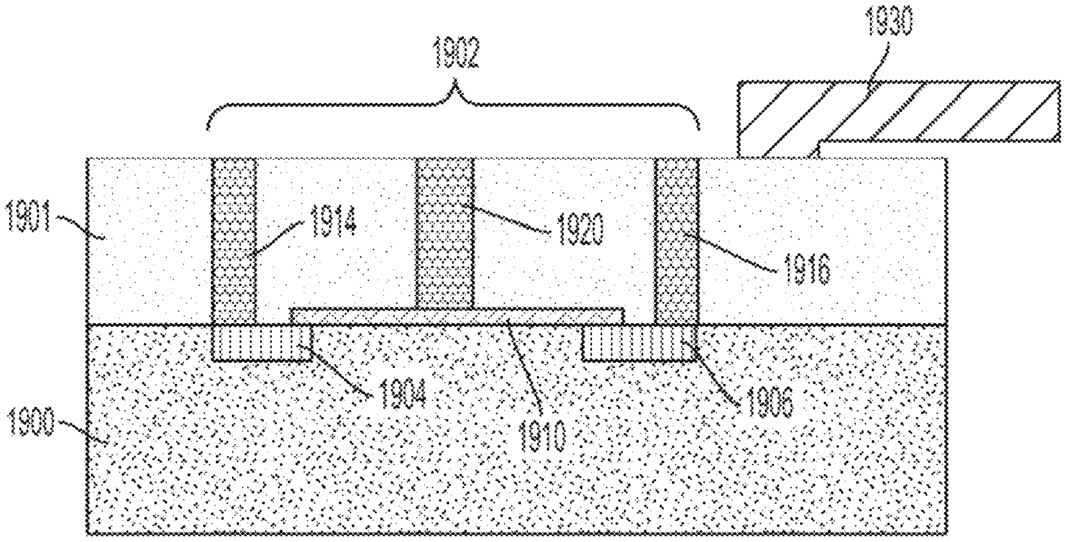
FIG. 19 is a cross sectional view of another MEMS substrate, in accordance with some embodiments.

In some embodiments, solid-state device switches may be formed within the silicon handle of a substrate, as shown in FIG. 19. FIG. 19 is a cross section of a silicon substrate having a silicon handle 1900, an oxide layer 1901, transistor 1902 and a MEMS layer 1930. Transistor 1902 is formed in the silicon handle 1900. Transistor 1902 includes source well 1904, source contact 1914, drain well 1906, drain contact 1916, gate region 1920 and gate contact 1920.

Figure 20:
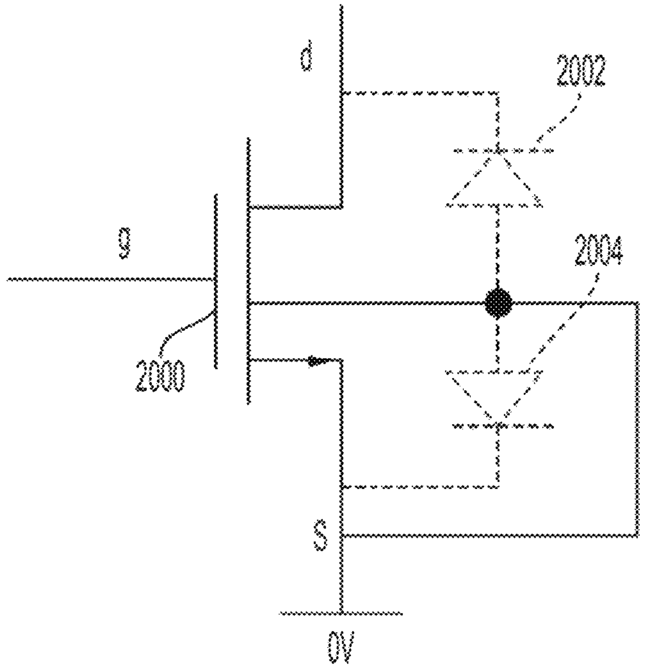
FIG. 20 is a circuit diagram of a switchable device include a transistor and a pair of diodes, in accordance with some embodiments.

In some embodiments, switchable devices of the types described herein may be implemented using circuits acting as a device than can be turned on and off. One example of such a circuit is depicted in FIG. 20. This circuit includes a transistor 2000, a diode 2002 connected between the gate of the transistor and the drain of the transistor, and a diode 2004 connected between the gate of the transistor and the source of the transistor. This circuit may be in an ON state for gate voltages greater than 20V (or other suitable voltages). Negative gate voltages place the diodes in forward bias, thereby forming a direct path to ground. When the circuit is in an OFF state, the diodes are driven to a negative potential.

Figure 21:
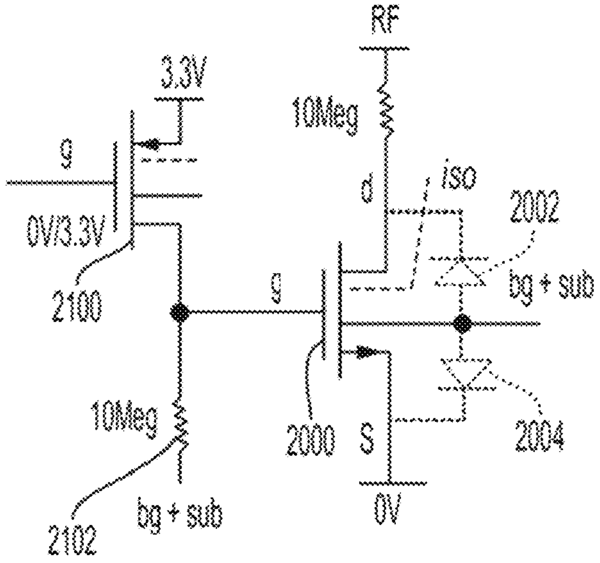
FIG. 21 is a circuit diagram of another switchable device include a transistor and a pair of diodes, in accordance with some embodiments.

Another such a circuit is depicted in FIG. 21. This circuit is similar to the circuit of FIG. 20, but further includes a transistor 2100 having the drain coupled to the gate of transistor 2000 and a resistor 2102 also coupled to the gate of transistor 2000. Here, transistor 2000 is turned off whenever transistor 2100 is turned off. In some circumstances, the on-off transition of the transistors may be too slow. To obviate this issue, in some embodiments, a sink current from the gates needs to be produced. In some embodiments, this may be accomplished by using current pumps of the order of 1 μA.

Figure 22:
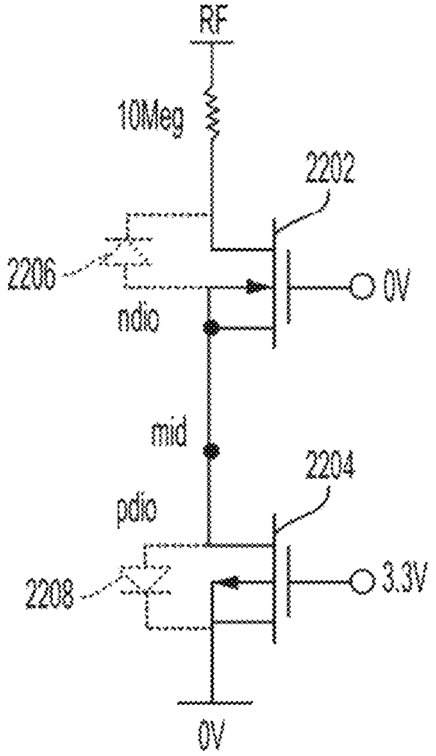
FIG. 22 is a circuit diagram of another switchable device include a pair of transistors, in accordance with some embodiments.

Another such a circuit is depicted in FIG. 22. This circuit includes a transistor 2202 in series with a transistor 2204. A diode 2206 is connected between the source and the bulk of transistor 2202. A diode 2208 is connected between the drain and source of transistor 2204. In the OFF state, positive voltages are blocked by transistor 2202, diode 2206 is forward biased, the "mid" node is pulled to 0V, transistor 2202 is OFF and diode 2208 is reverse biased. In the ON state, transistor 2204 is ON (though it may be in the saturation region).

Figure 23:
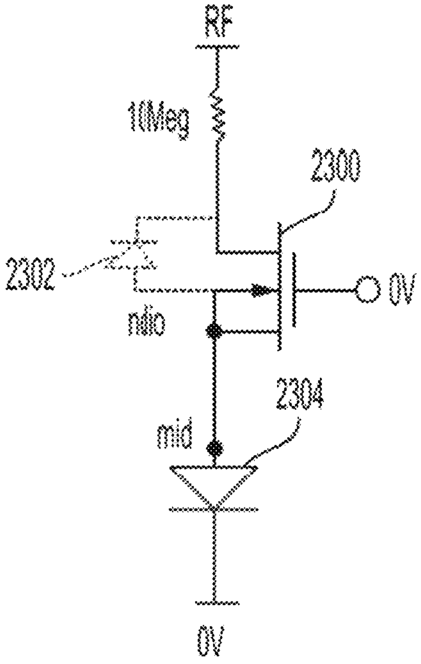
FIG. 23 is a circuit diagram of a switchable device include a transistors and a pair of diodes, in accordance with some embodiments.

Another such a circuit is depicted in FIG. 23. This circuit includes a transistor 2300 in series with a diode 2304. A diode 2302 is connected between the source and the bulk of transistor 2300. In the OFF state, positive voltages are blocked by transistor 2300, diode 2302 is forward biased, diode 2304 is reversed biased and the "mid" node is pulled to a negative voltage. In the ON state, the transistor is ON and the "mid" node is pulled to approximately 0.7V. Diode 2304 is reversed biased so that the circuit cannot be activated in the presence of a negative voltage.

Figure 24:
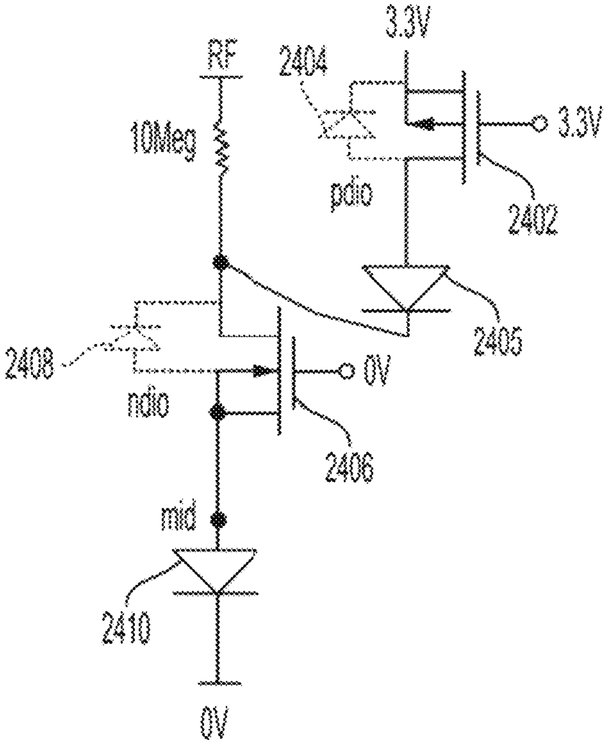
FIG. 24 is a circuit diagram of a switchable device include a pair of transistors and a plurality of diodes, in accordance with some embodiments.

Another such a circuit is depicted in FIG. 24. This circuit includes a transistor 2402, and diode 2404 connected between the source and bulk of transistor 2402. Transistor 2402 is connected to the anode of a diode 2405. The cathode of diode 2405 is connected to transistor 2406. Diode 2408 is connected between the drain and bulk of transistor 2406. Transistor 2406 is further connected to diode 2410. In the OFF state, positive voltages are blocked by transistor 2406 and diode 2405, while negative voltages are blocked by transistor 2402 and diode 2410. In the ON state, positive voltages are supported by transistor 2406 and diode 2410. Transistor 2406 may saturate in some embodiments, and may pull the "mid" node to approximately 0.7V.

Figure 25:
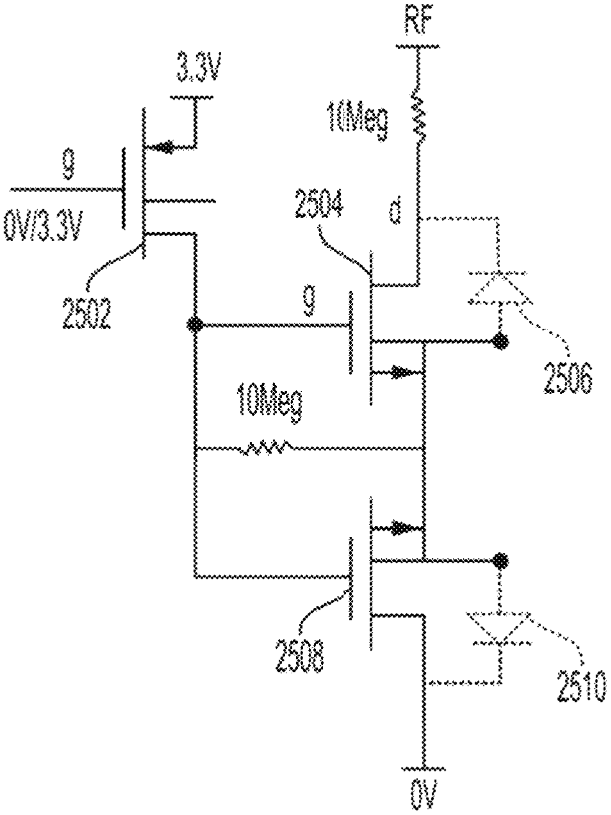
FIG. 25 is a circuit diagram of a switchable device include a plurality of transistors and a plurality of diodes, in accordance with some embodiments.

Another such a circuit is depicted in FIG. 25. This circuit includes a transistor 2504, a diode 2506 connected between the drain and bulk of transistor 2504, a transistor 2508 and a diode 2510 connected between the drain and bulk of transistor 2508. A transistor 2502 is connected to the gates of transistors 2504 and 2508. In the OFF state, the gate voltages of transistors 2504 and 2508 are approximately 3.3V and the diodes block current flow. The node between transistors 2504 and 2508 is pulled to approximately 0.7V. In the ON state, the gate voltages of transistors 2504 and 2508 are approximately 0V and current flows to ground.

Some embodiments relate to switchable devices implemented using circuits formed by monolithically integrated diodes. Examples of such circuits are shown in FIGS. 26A-26G. The circuit of FIG. 26A includes a Zener diode 2600 having the cathode connected to resistor 2602. This circuit allows a certain amount of positive voltage. The cathode of the Zener diode is held to negative voltages. The Zener diode may be pulled to negative voltages until the Zener voltage is reached (e.g., 5V).

Figures 26A, 26B, 26C, 26D, 26E, 26F, 26G:
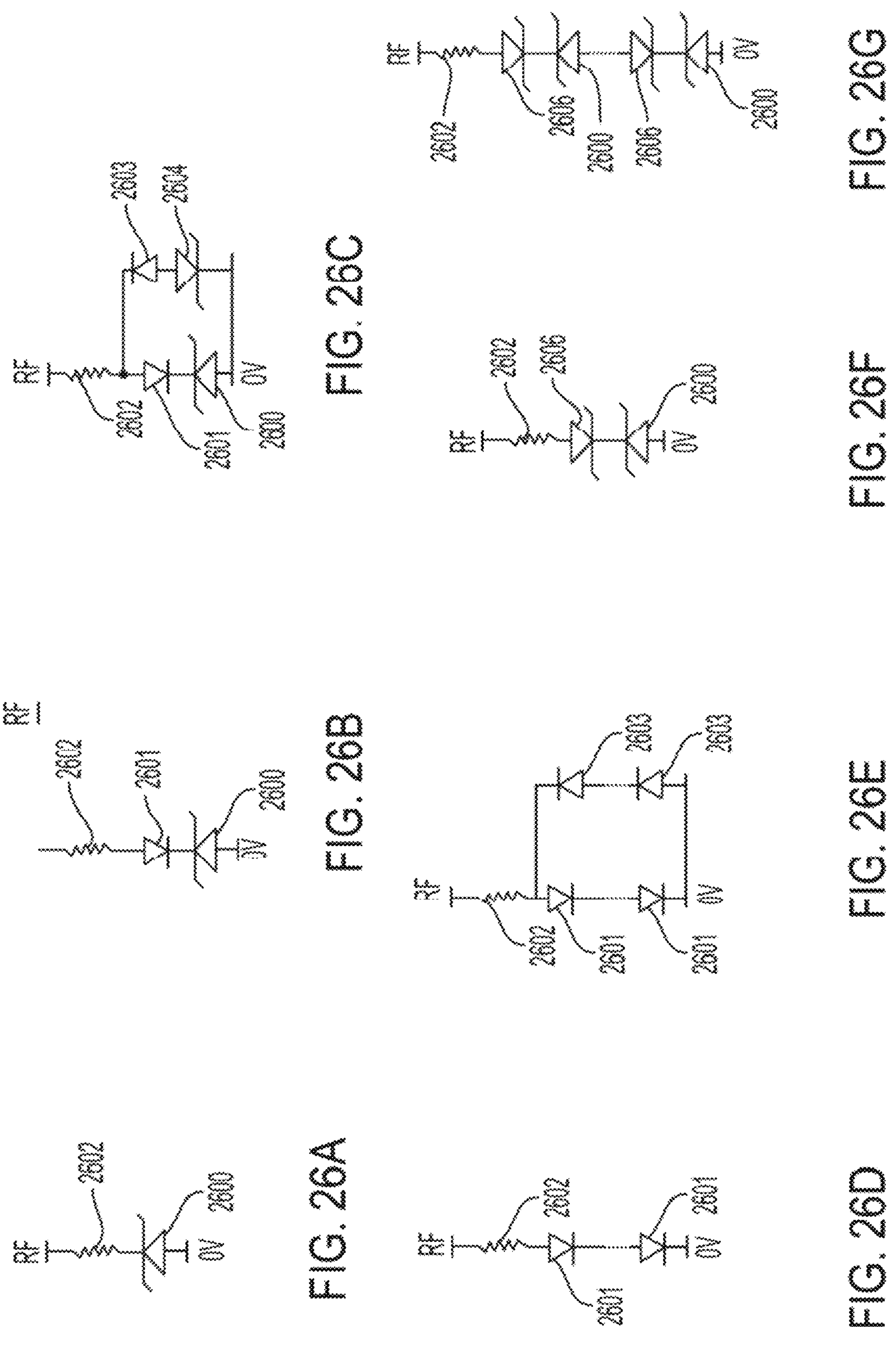
FIGS. 26A-26G are circuit diagrams of diode-based switchable devices, in accordance with some embodiments.

The circuit of FIG. 26B includes a Zener diode 2600 having the cathode connected to the cathode of diode 2601. The anode of diode 2601 is connected to resistor 2602. Similar to the circuit of FIG. 26A, this circuit allows a certain amount of positive voltage. The limit of this circuit, however, is 5.7V instead of just 5V.

The circuit of FIG. 26C is similar to the circuit of FIG. 26B. In addition, it further includes a parallel path including diode 2603 and Zener diode 2604 (having the anodes connected to one another). This circuit is designed to clamp positive and negative voltages.

The circuit of FIG. 26D includes a stack of diodes 2601 connected in series to one another and in series to resistor 2602. This circuit allows for selectable positive voltage clamping, depending on the number of diodes 2601 included in the stack.

The circuit of FIG. 26E is similar to the circuit of FIG. 26D. In addition, it further includes a parallel path including a stack of diodes 2603. This circuit is designed to clamp positive and negative voltages and allows for selectable positive and negative voltage clamping, depending on the number of diodes 2601 and diodes 2603 included in the respective stacks.

The circuit of FIG. 26F includes a pair of Zener diodes 2600 and 2606 having the cathodes connected to one another. This circuit clamps positive and negative voltages to about 5.7V and −5.7V, respectively.

The circuit of FIG. 26G includes a stack of blocks, each block including a Zener diode 2600 connected to a Zener diode 2603 in the same arrangement as shown FIG. 26F. This circuit allows for selectable positive and negative voltage clamping, depending on the number of Zener diodes included in the stack. It should be noted that the Zener diodes depicted in FIGS. 26A-26C and 26F-26G can be replaced with silicon controlled rectifiers (SCR) or transient voltage suppression (TVS) diodes, in some embodiments.

Figure 27A:
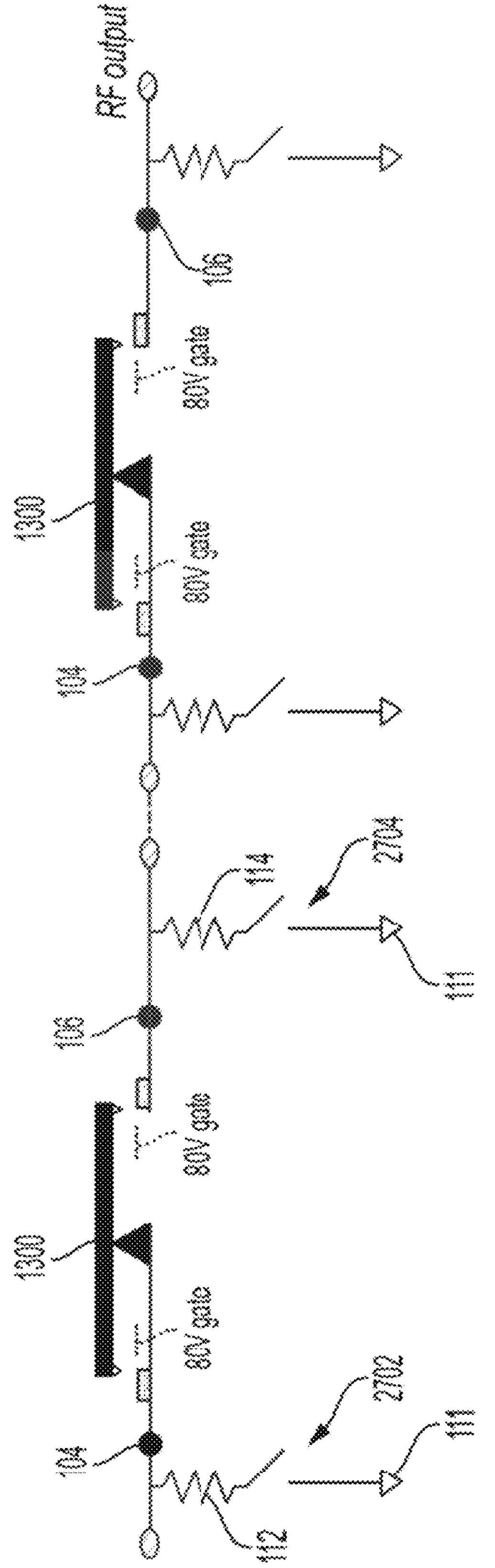
FIG. 27A is a schematic diagram of a plurality of teeter-totter MEMS switches each having switchable resistive charge bleed circuits, in accordance with some embodiments.
Figure 27B:
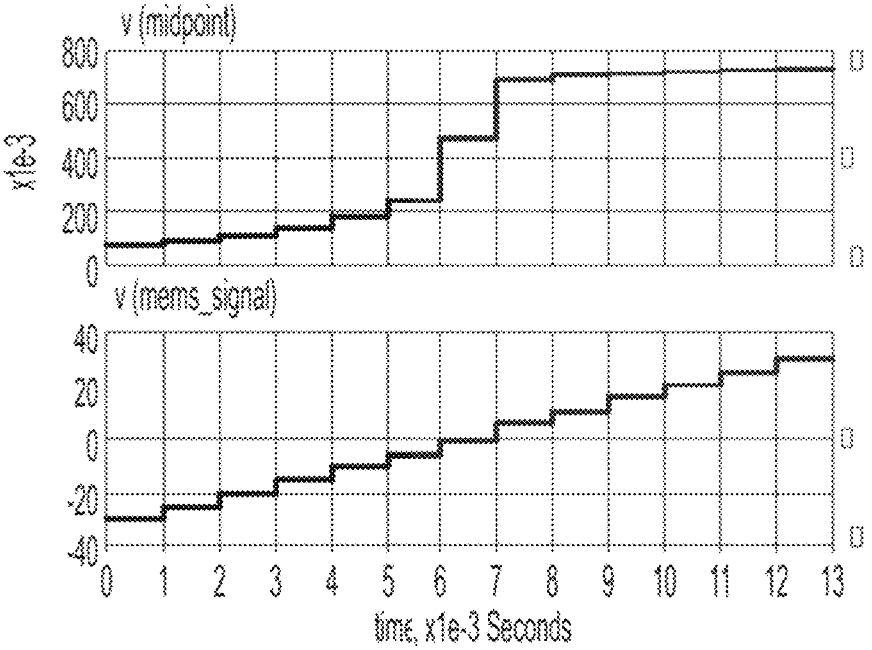
FIGS. 27B-27C are plots illustrating voltages associated with the teeter-totter MEMS switches of FIG. 27A, in accordance with some embodiments.
Figure 27C:
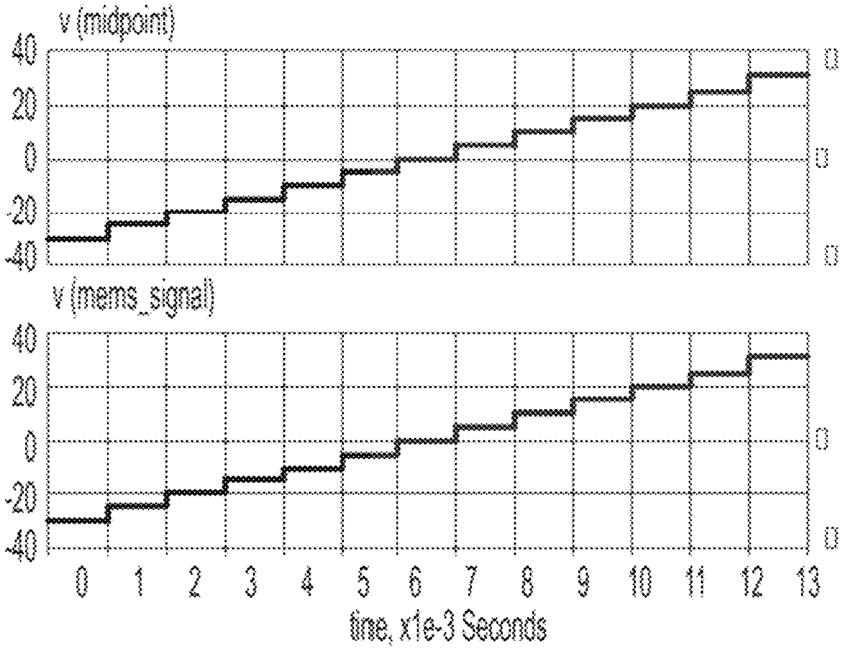

FIG. 27 is a schematic diagram illustrating an example arrangement including multiple teeter-totter MEMS switches connected in series, in accordance with some embodiments. Each MEMS switch 1300 includes a first node 104 and a second node 106. Each node 104 is connected to fixed potential 111 through a switchable device 2702 in series with a resistor 112. Each node 106 is connected to fixed potential 111 through a switchable device 2704 in series with a resistor 114. The switchable devices may be implemented in accordance with any of the arrangements described herein. In some embodiments, to support input RF powers as high as 36 dBm or even 40 dBm, the resistance of resistors 112 and 114 may be selected to be as high as 1-10MΩ. The high resistance prevents the nodes 104 and 106 from floating.

FIG. 28A is a plot illustrating how the voltage at node 106 (V midpoint) varies over time as the input voltage (mems signal) is increased over time with the switchable devices set to the ON state. In this example, the input voltage is ramped from −30V to 30V in steps of 1 ms each. As shown in the figure, node 106 can comfortably hold voltages between 100 mV and 700 mV. FIG. 28B is a plot illustrating how the voltage at node 106 varies over time as the input voltage is increased over time with the switchable devices set to the OFF state. As shown in this figure, as the input voltage is ramped from −30V to 30V, the voltage at node 106 properly tracks the input voltage, meaning that it does not interfere with the signal path.

Aspects of the technology described herein may provide one or more benefits, some of which have been previously described. Now described are some examples of such benefits. It should be appreciated that not all aspects and embodiments necessarily provide all of the benefits now described. Further, it should be appreciated that aspects of the technology described herein may provide additional benefits to those now described.

Aspects of the technology described herein allow resistive charge bleed circuits to be connected and disconnected from a node of a MEMS device, which allows the MEMS device to be used for low voltage applications requiring high accuracy.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases.

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A microelectromechanical systems (MEMS) device comprising:
- a MEMS switch;
- a circuit node electrically connected to a side of the MEMS switch;
- a charge bleed circuit comprising a switchable device and a resistor in series with the switchable device, the charge bleed circuit connecting the circuit node to a fixed electric potential; and
- control circuitry configured to maintain the switchable device in a non-conductive state during a time interval in which the MEMS switch is in a conductive state;
- wherein the resistor is monolithically integrated with the MEMS switch.

2. The MEMS device of claim 1, wherein the circuit node is a first circuit node, the side of the MEMS switch is a first side, and the charge bleed circuit is a first charge bleed circuit, and the switchable device is a first switchable device, and wherein the MEMS device further comprises:
- a second circuit node electrically connected to a second side of the MEMS switch; and
- a second charge bleed circuit comprising a second switchable device, the second charge bleed circuit connecting the second circuit node to the fixed electric potential.

3. The MEMS device of claim 2, wherein the control circuitry is further configured to maintain the second switchable device in a non-conductive state during the time interval.

4. The MEMS device of claim 1, wherein the switchable device comprises a MEMS switch.

5. The MEMS device of claim 1, wherein the switchable device comprises a solid-state device switch.

6. The MEMS device of claim 5, wherein the solid-state device switch comprises a field effect transistor (FET) and/or a diode.

7. The MEMS device of claim 1, wherein:
- when the switchable device is in a conductive state, the resistor couples the circuit node to the fixed electric potential, and
- when the switchable device is in the non-conductive state, the circuit node is floating.

8. The MEMS device of claim 1, wherein the MEMS switch comprises a cantilevered MEMS switch or a teeter-totter MEMS switch.

9. A microelectromechanical systems (MEMS) device comprising:
- a MEMS switch;
- a circuit node electrically connected to a side of the MEMS switch;
- a resistive charge bleed circuit comprising a switchable device and a resistor monolithically integrated with the MEMS switch, the resistive charge bleed circuit connecting the circuit node to a fixed electric potential; and
- control circuitry configured to maintain the switchable device coupled to the fixed electric potential when the MEMS switch is in a conductive state.

10. The MEMS device of claim 9, wherein the circuit node is a first circuit node, the side of the MEMS switch is a first side, and the charge bleed circuit is a first resistive charge bleed circuit, and the switchable device is a first switchable device, and wherein the MEMS device further comprises:

a second circuit node electrically connected to a second side of the MEMS switch; and a second resistive charge bleed circuit comprising a second switchable device, the second resistive charge bleed circuit connecting the second circuit node to the fixed electric potential.

11. The MEMS device of claim 10, wherein the control circuitry is further configured to maintain the second switchable device coupled to the fixed electric potential when the MEMS switch is in a conductive state.

12. The MEMS device of claim 9, wherein the switchable device comprises a MEMS switch.

13. The MEMS device of claim 9, wherein the switchable device comprises a solid-state device switch.

14. The MEMS device of claim 9, wherein:

when the switchable device is in a conductive state, the resistive charge bleed circuit couples the circuit node to the fixed electric potential, and when the switchable device is in a non-conductive state, the circuit node is floating.

15. A method of operating a microelectromechanical systems (MEMS) device comprising a MEMS switch, the method comprising:

decoupling a side of the MEMS switch from a fixed electric potential by interrupting a resistive charge bleed circuit, wherein interrupting the charge bleed circuit comprises turning off a switchable device;

at a first time, turning on the MEMS switch; and at a second time subsequent to the first time, turning off the MEMS switch, wherein, during at least a time interval defined between the first time and the second time, the side of the MEMS switch is decoupled from the fixed electric potential; and wherein the resistive charge bleed circuit comprises a resistor monolithically integrated with the MEMS switch.

16. The method of claim 15, wherein decoupling the side of the MEMS switch from the fixed electric potential occurs prior to the first time.

17. The method of claim 15, wherein decoupling the side of the MEMS switch from the fixed electric potential occurs at the first time.

18. The method of claim 15, further comprising coupling the side of the MEMS switch to the fixed electric potential by forming the resistive charge bleed circuit, wherein forming the charge bleed circuit comprises turning on the switchable device, wherein coupling the side of the MEMS switch to the fixed electric potential occurs at, or subsequent to, the second time.

* * * * *